(12) United States Patent
Phillips et al.

(10) Patent No.: US 9,947,637 B2
(45) Date of Patent: Apr. 17, 2018

(54) SYSTEM AND METHOD FOR CLAMPING WAFERS TOGETHER IN ALIGNMENT USING PRESSURE

(71) Applicant: Nikon Corporation, Chiyoda-ku, Tokyo (JP)

(72) Inventors: Alton H. Phillips, East Palo Alto, CA (US); Fardad A. Hashemi, Moraga, CA (US)

(73) Assignee: NIKON CORPORATION (JP)

( * ) Notice: Subject to any disclaimer, the term of this patent is extended or adjusted under 35 U.S.C. 154(b) by 555 days.

(21) Appl. No.: 14/519,838

(22) Filed: Oct. 21, 2014

(65) Prior Publication Data

US 2015/0122412 A1 May 7, 2015

Related U.S. Application Data

(60) Provisional application No. 61/899,082, filed on Nov. 1, 2013, provisional application No. 61/899,071, filed on Nov. 1, 2013.

(51) Int. Cl.
*B32B 37/10* (2006.01)
*H01L 23/00* (2006.01)
*H01L 21/67* (2006.01)

(52) U.S. Cl.
CPC .............. *H01L 24/83* (2013.01); *B32B 37/10* (2013.01); *H01L 21/67092* (2013.01); *B32B 2037/1063* (2013.01); *B32B 2457/14* (2013.01); *H01L 2224/8312* (2013.01); *H01L 2224/83203* (2013.01); *H01L 2924/01322* (2013.01); *H01L 2924/15787* (2013.01)

(58) Field of Classification Search
CPC .......................... H01L 24/83; H01L 21/67092
See application file for complete search history.

(56) References Cited

U.S. PATENT DOCUMENTS

| | | | |
|---|---|---|---|
| 3,960,623 A | 5/1976 | Gantley | |
| 3,960,635 A * | 6/1976 | La Roy | B29C 43/3607 156/286 |
| 5,273,553 A * | 12/1993 | Hoshi | H01L 21/67092 148/DIG. 6 |
| 7,524,920 B2 | 4/2009 | Pecorini et al. | |
| 7,948,034 B2 | 5/2011 | George et al. | |
| 8,147,630 B2 | 4/2012 | George | |
| 8,206,525 B2 | 6/2012 | Izumi | |

(Continued)

OTHER PUBLICATIONS

Final Rejection issued by the U.S. Patent Office dated Jan. 19, 2018 in U.S. Appl. No. 14/519,831.

*Primary Examiner* — Daniel McNally
(74) *Attorney, Agent, or Firm* — Roeder & Broder LLP; Steven G. Roeder

(57) ABSTRACT

A system and method for clamping wafers together in alignment using pressure. The system and method involves holding a first wafer and a second wafer together in alignment using a wafer clamp within an ambient environment maintained at a first pressure and creating a second pressure at least partially around and between the first wafer and the second wafer held together by the wafer clamp, wherein the first pressure is greater than the second pressure. The first wafer and the second wafer are clamped together in alignment using a pneumatic force created by a pressure differential between the first pressure and the second pressure.

38 Claims, 19 Drawing Sheets

(56) References Cited

U.S. PATENT DOCUMENTS

| | | | |
|---|---|---|---|
| 8,425,715 B2 | 4/2013 | George | |
| 2003/0145943 A1* | 8/2003 | Lee | B32B 37/0046 |
| | | | 156/285 |
| 2003/0178468 A1 | 9/2003 | Lee et al. | |
| 2004/0089415 A1* | 5/2004 | Byun | B32B 38/1858 |
| | | | 156/285 |
| 2005/0186517 A1 | 8/2005 | Kochersperger | |
| 2008/0124199 A1 | 5/2008 | Hwang et al. | |
| 2009/0114348 A1* | 5/2009 | Hwang | B32B 37/0046 |
| | | | 156/536 |
| 2011/0005066 A1* | 1/2011 | Crofoot | B32B 37/003 |
| | | | 29/623.5 |
| 2012/0205024 A1 | 8/2012 | Sugaya et al. | |
| 2012/0251789 A1 | 10/2012 | Tanaka | |
| 2013/0008581 A1 | 1/2013 | Yuki et al. | |
| 2013/0155385 A1* | 6/2013 | Hashemi | G03F 7/70841 |
| | | | 355/76 |
| 2015/0122414 A1 | 5/2015 | Phillips | |

* cited by examiner

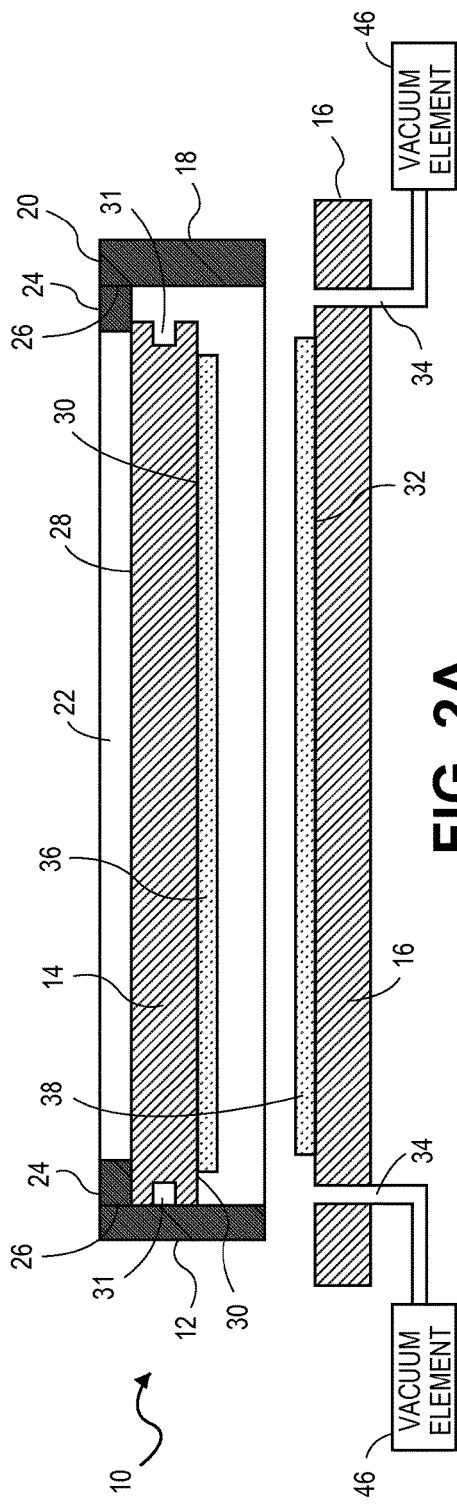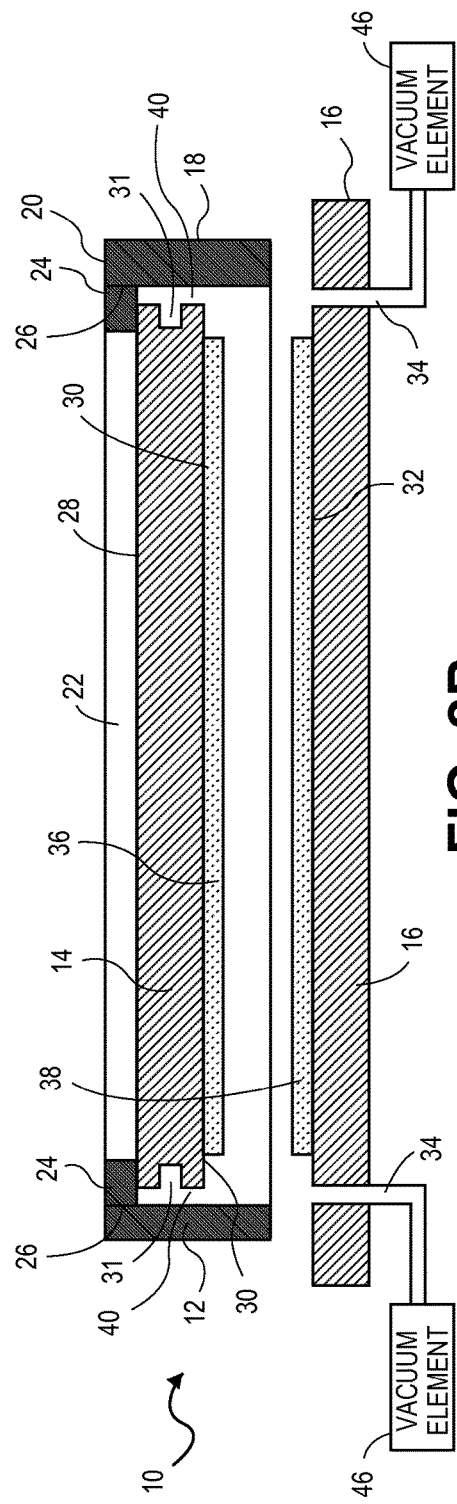

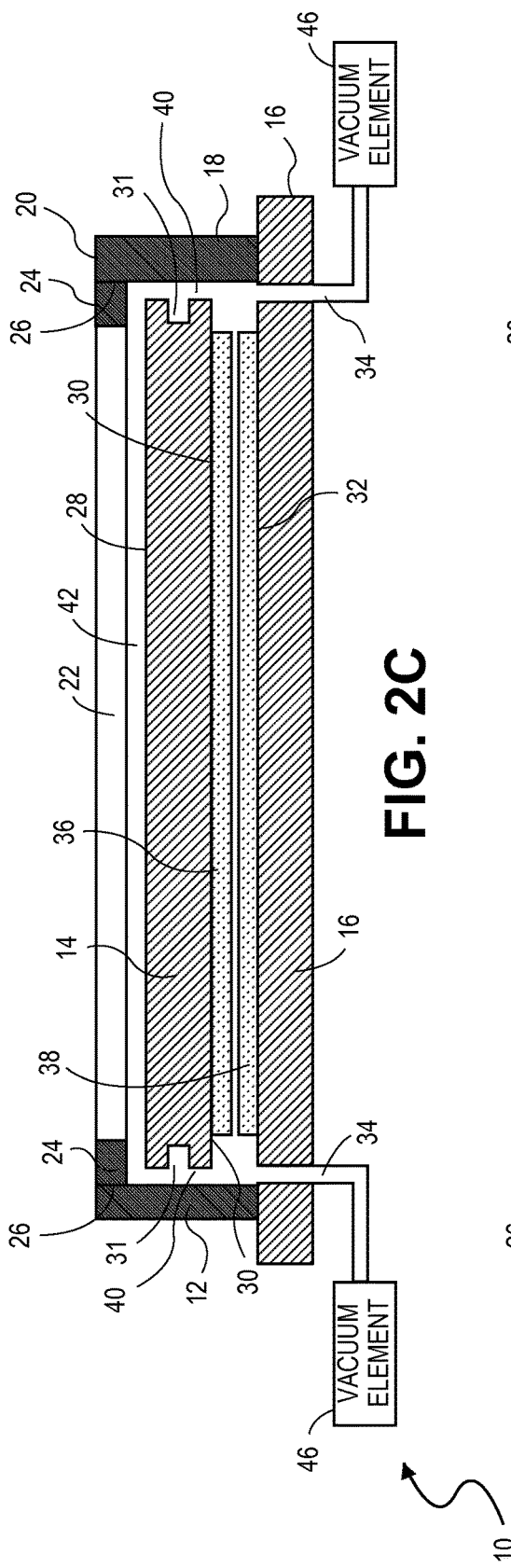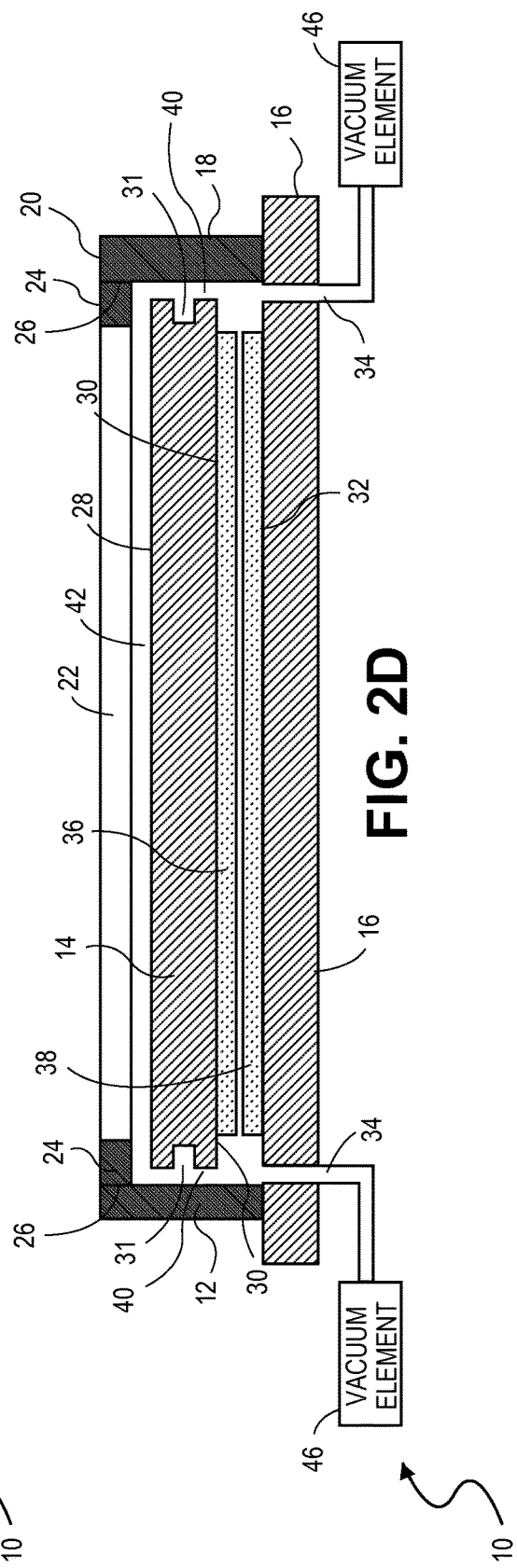

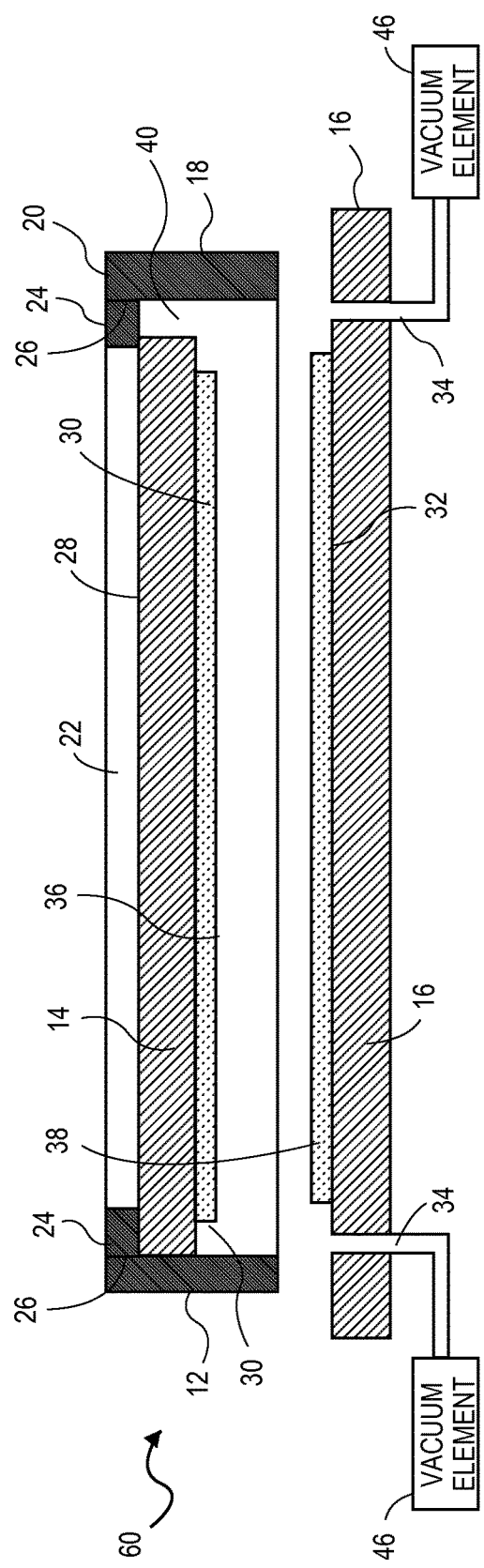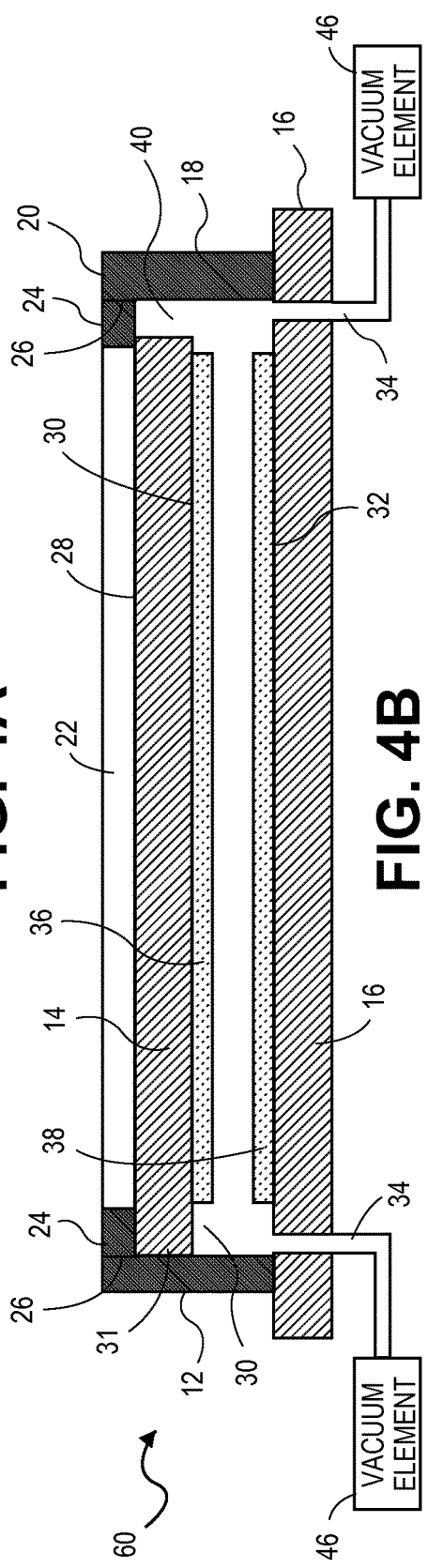

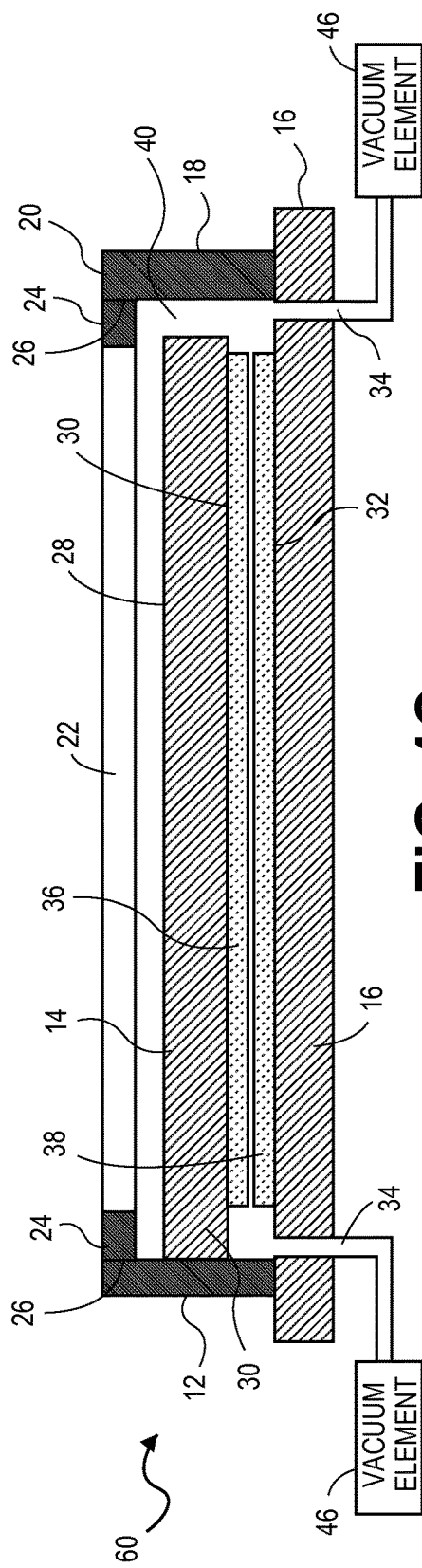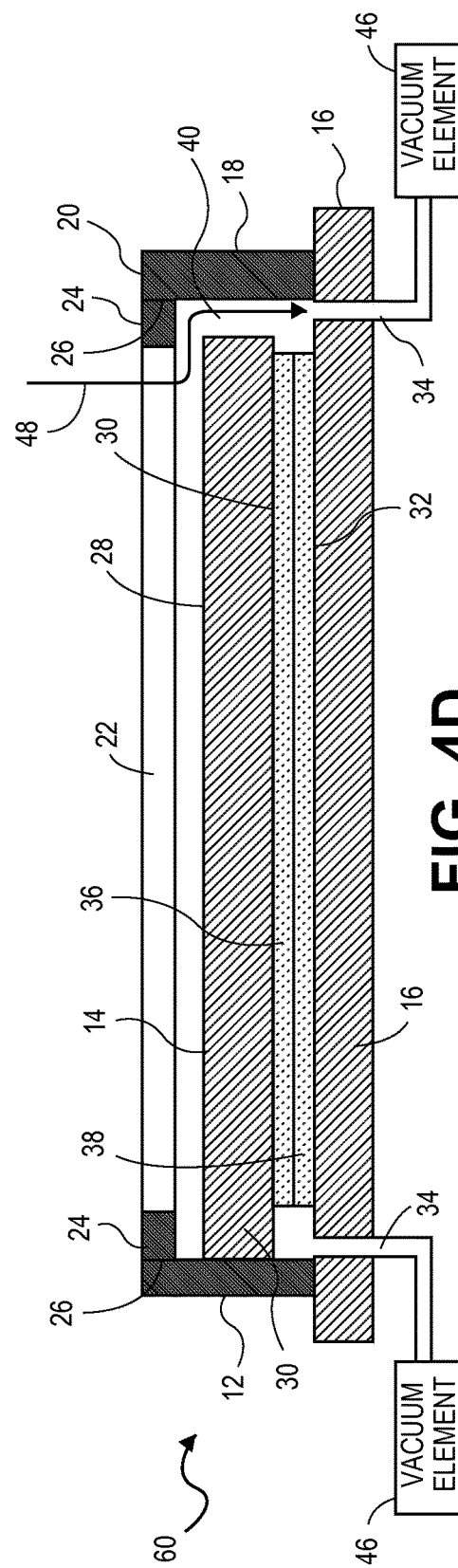

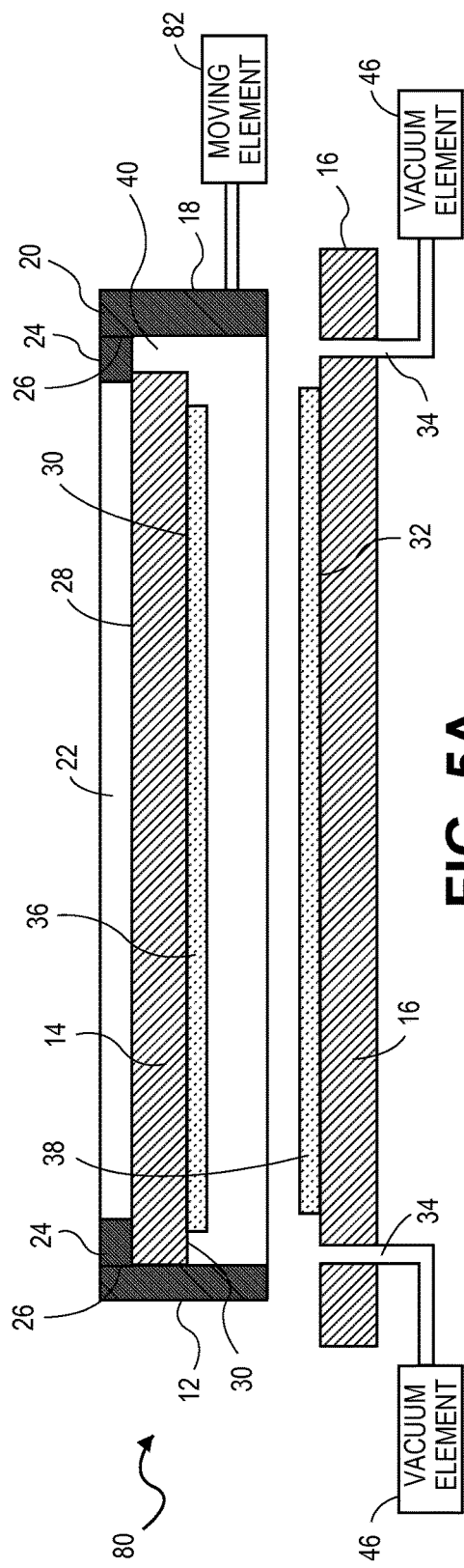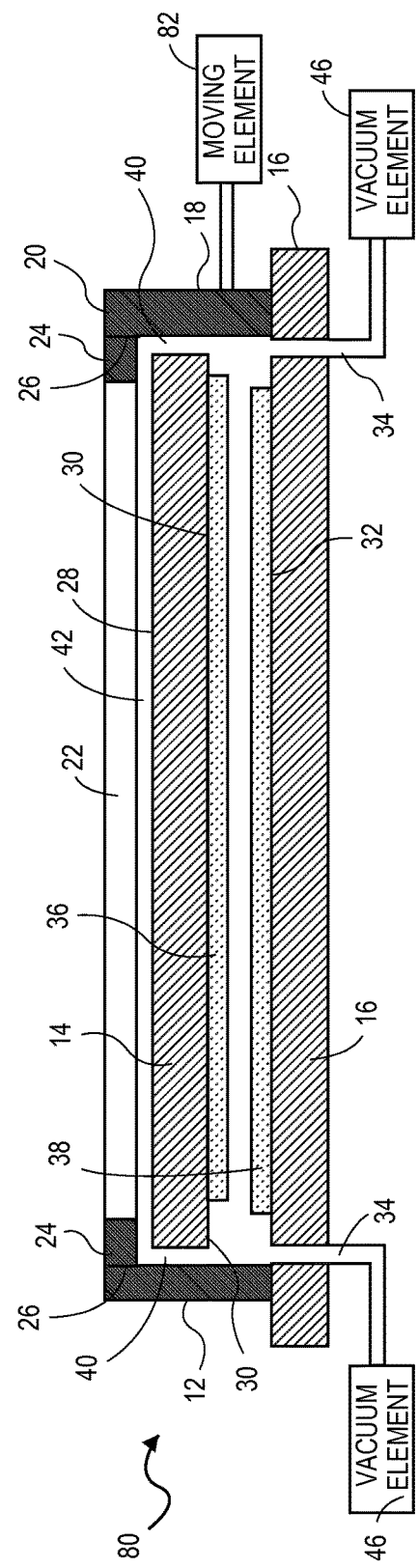
FIG. 5A
FIG. 5B

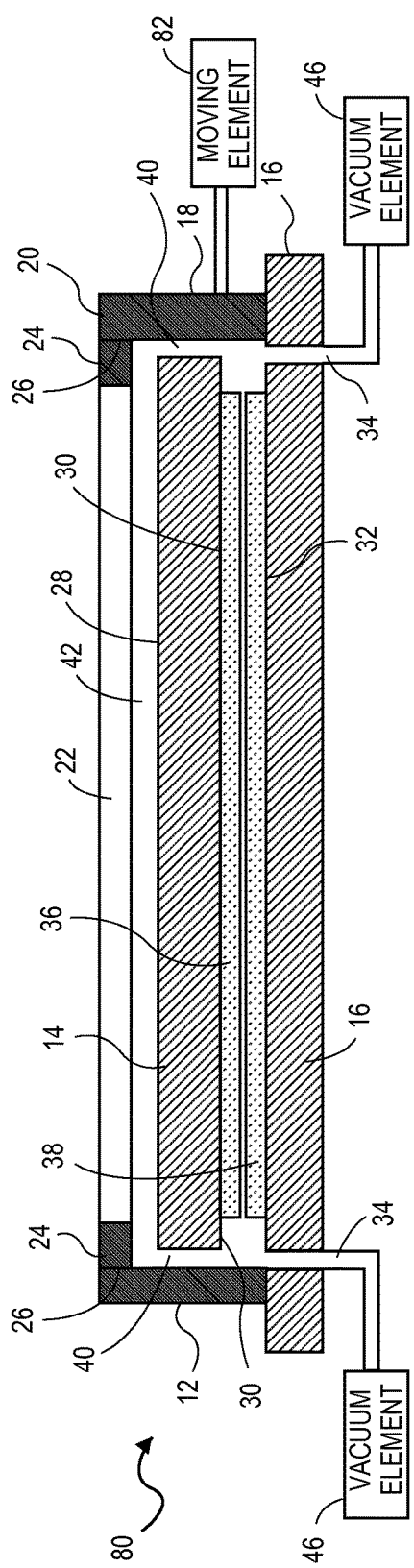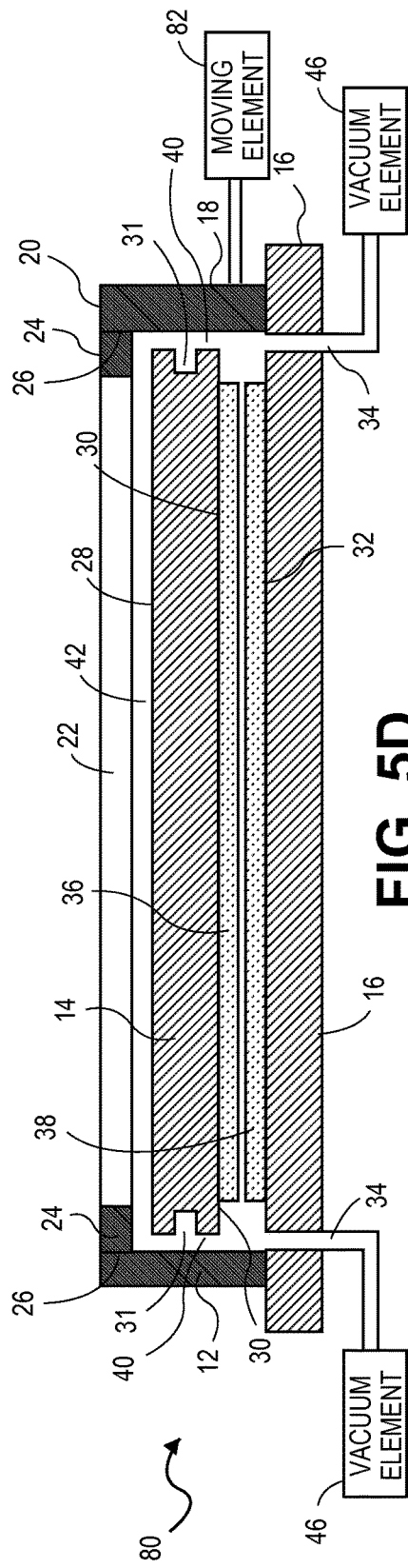

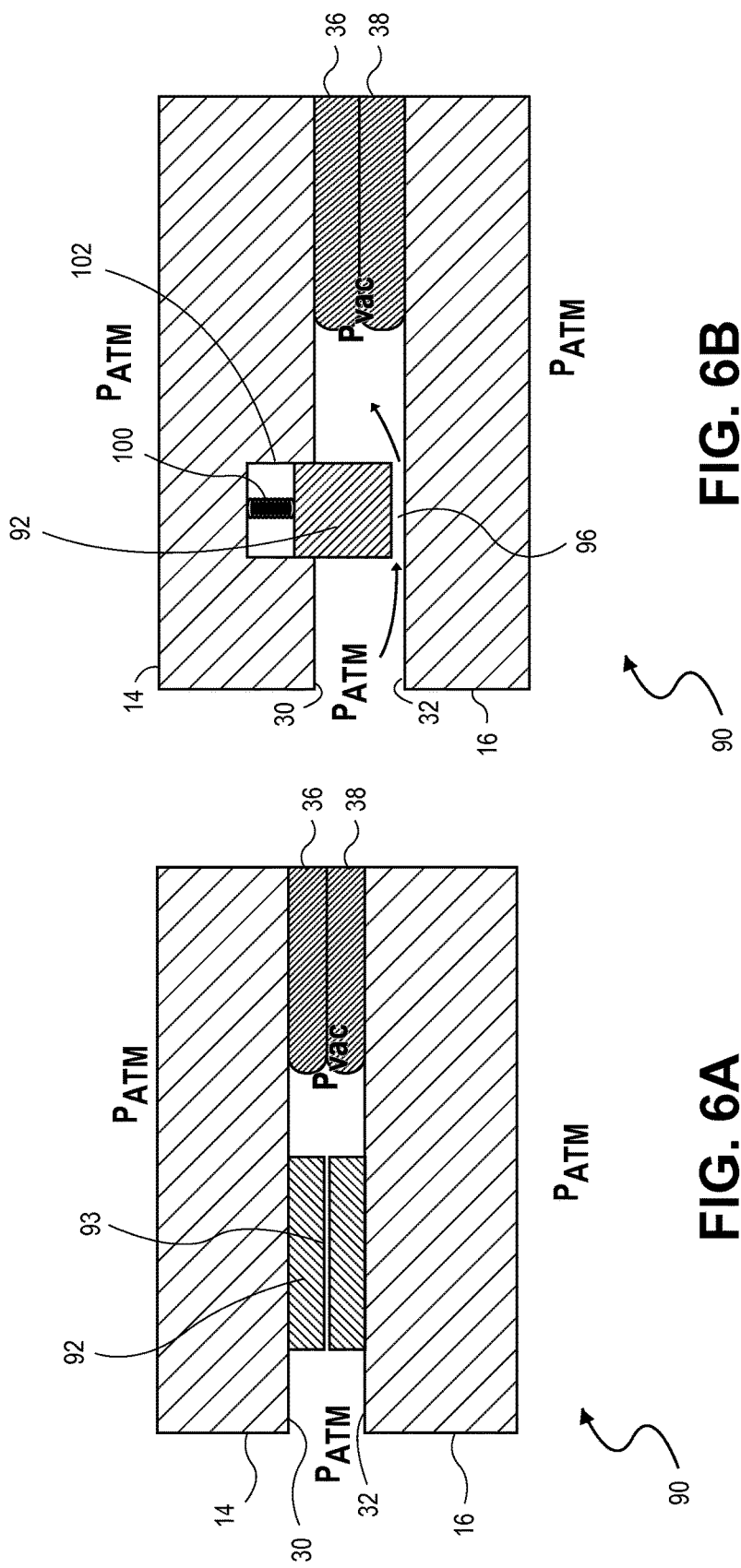

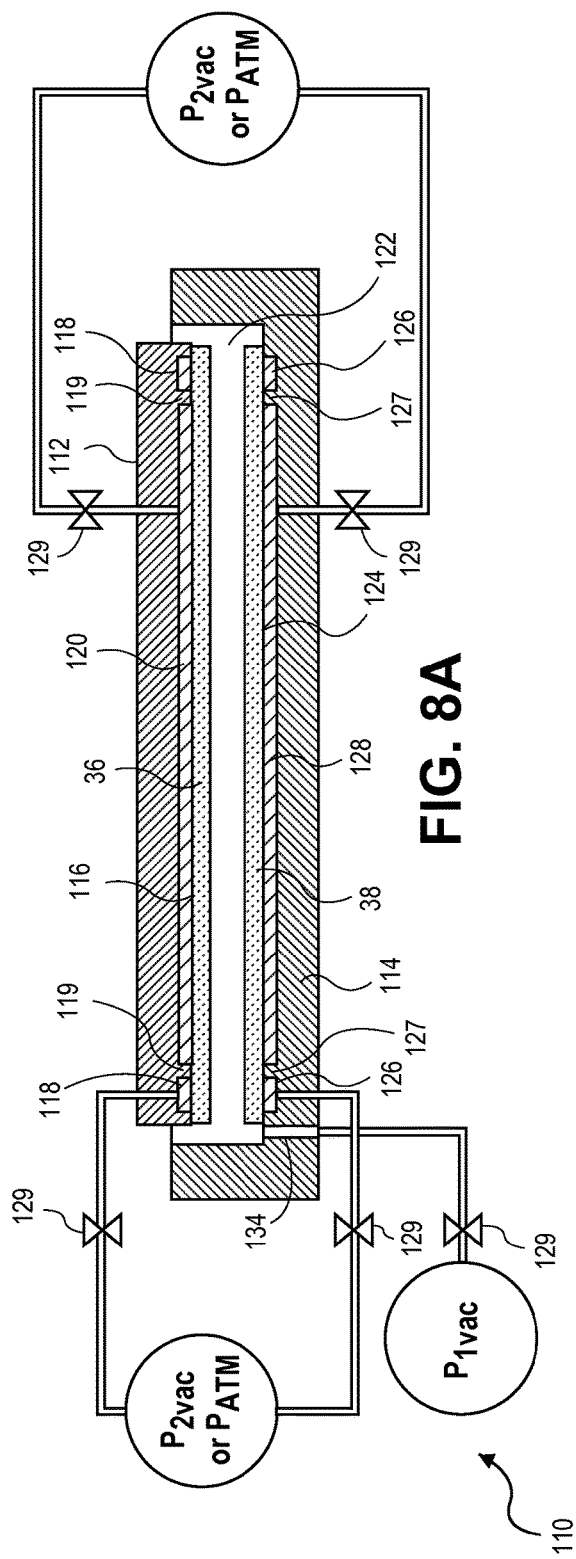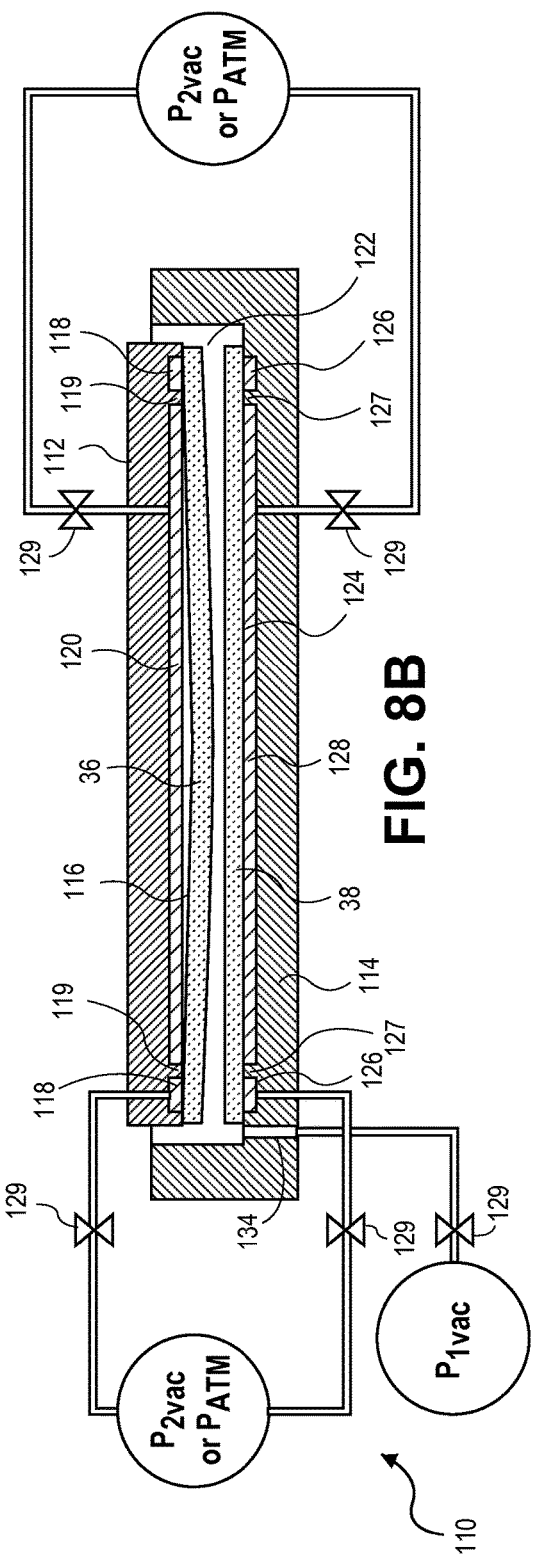

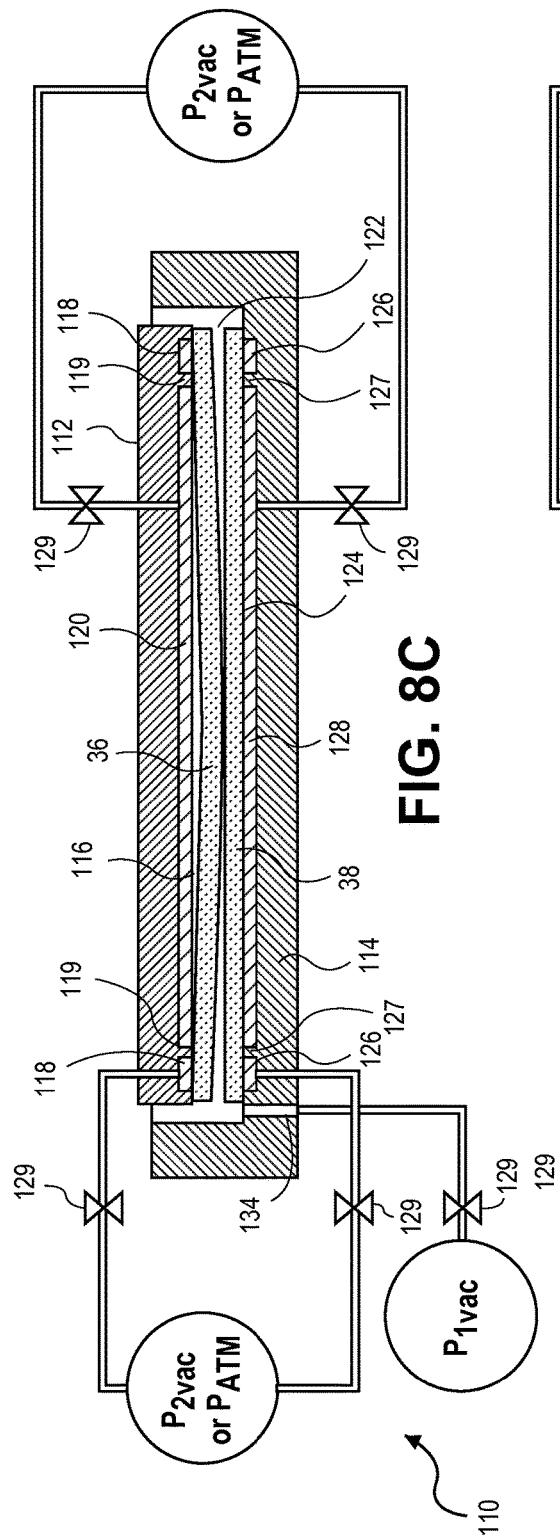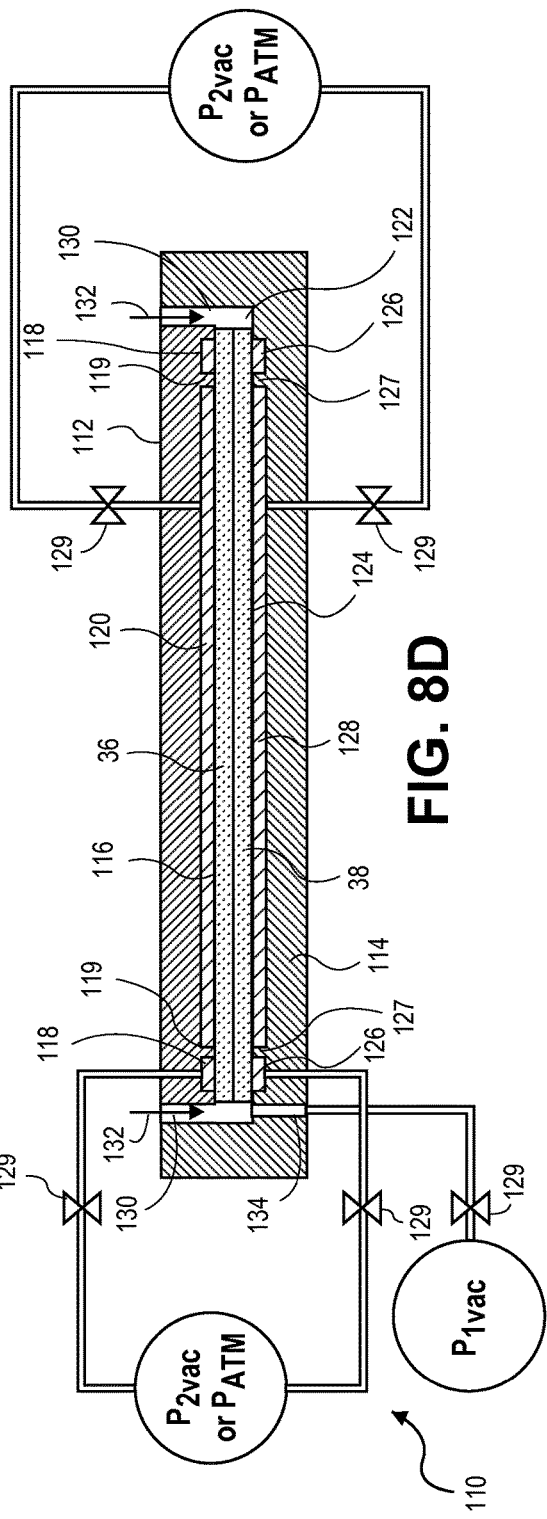

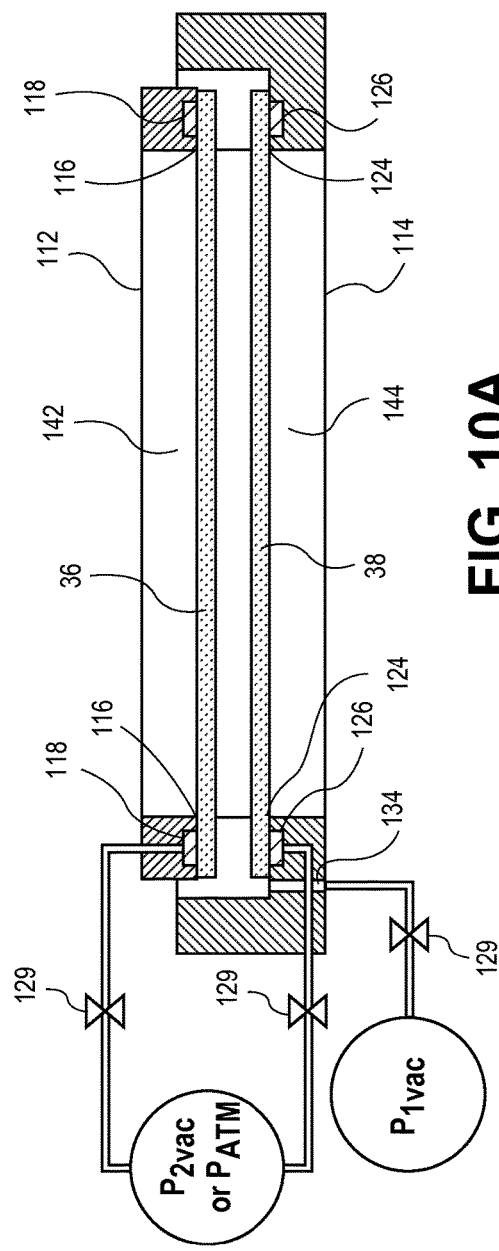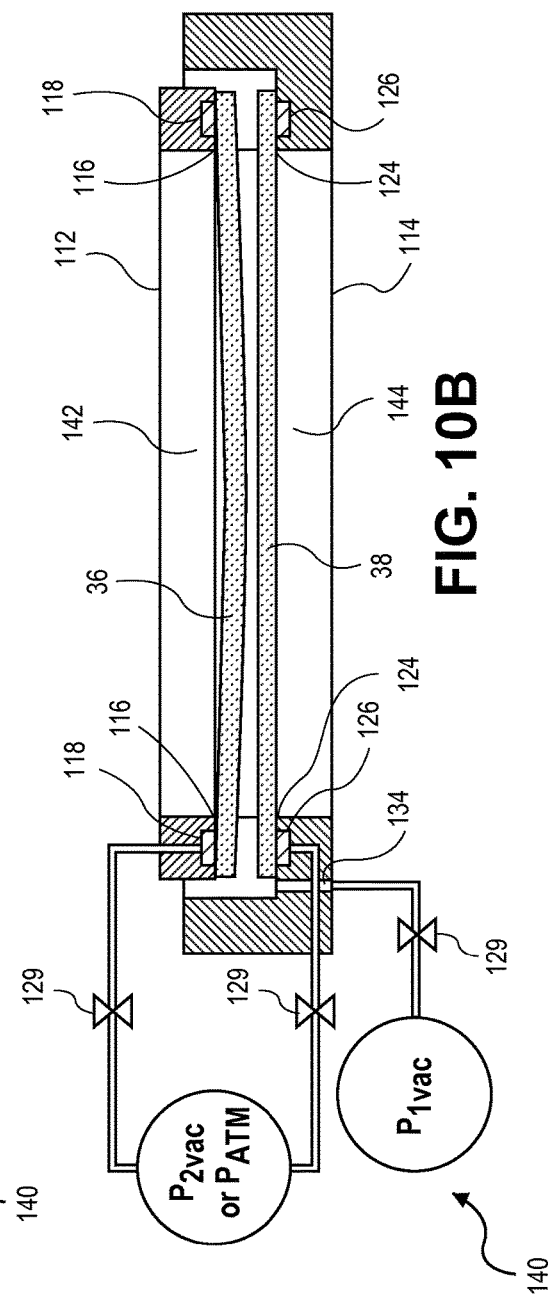

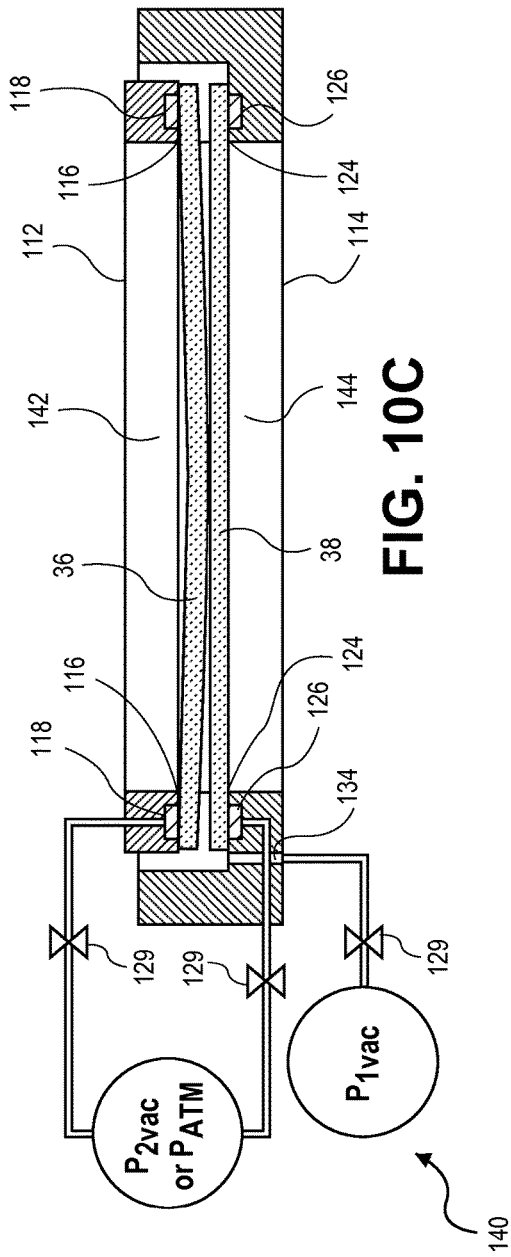
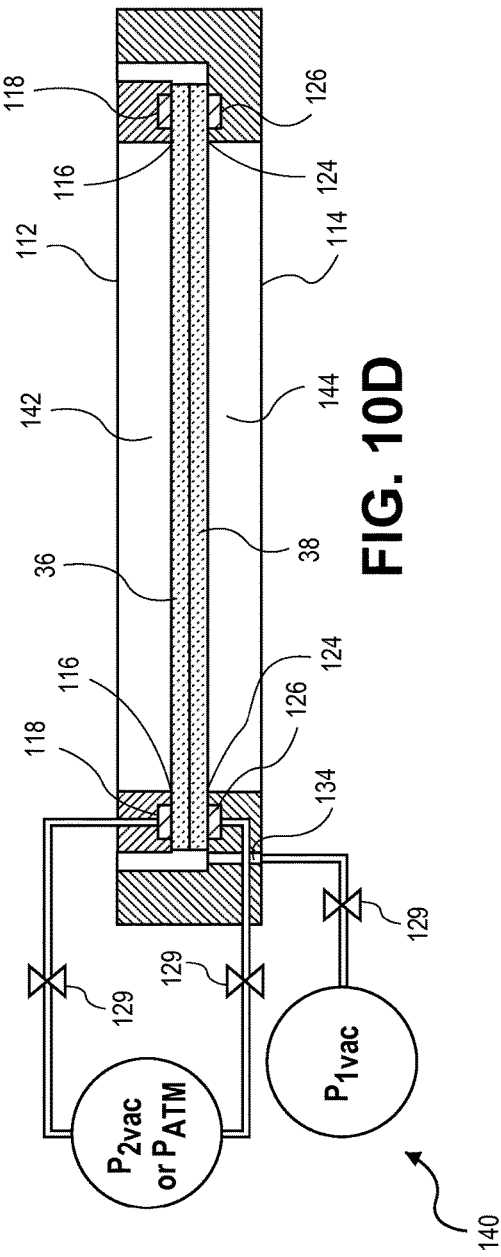

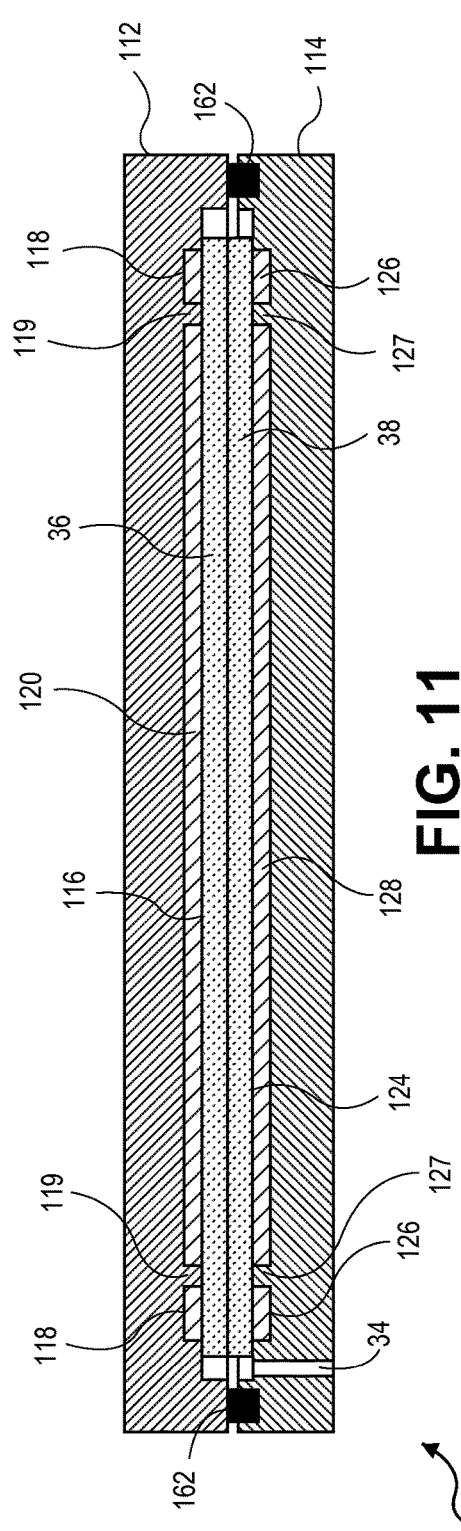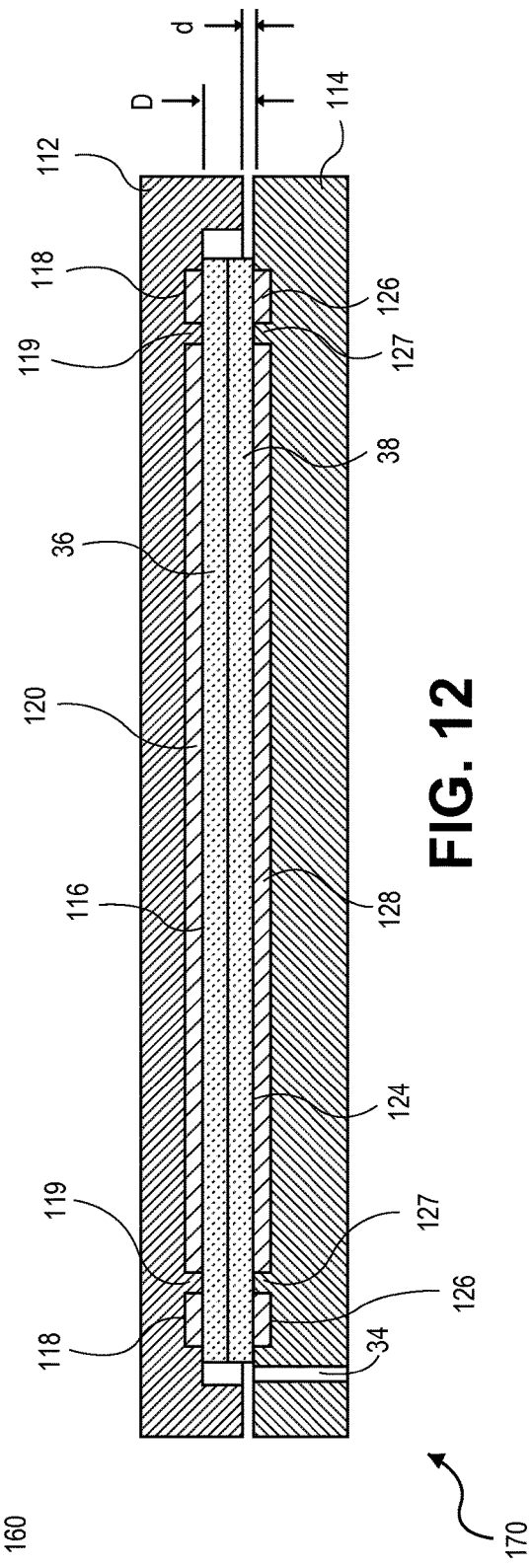

SYSTEM AND METHOD FOR CLAMPING WAFERS TOGETHER IN ALIGNMENT USING PRESSURE

CROSS REFERENCE TO RELATED APPLICATIONS

This application claims the benefit of U.S. Provisional Application Nos. 61/899,071 entitled "Wafer Bonding System and Method," and 61/899,082 entitled "System and Method for Clamping Wafers Together in Alignment Using Pressure," both filed Nov. 1, 2013, and both incorporated by reference herein for all purposes.

BACKGROUND

Field of the Invention

This invention relates to a semiconductor wafer clamp for clamping two wafers together in alignment, and more particularly, to a wafer clamp that clamps two wafers together in alignment using a pressure differential between a vacuum created between the wafer-clamping surfaces of the clamp and the ambient environment surrounding the wafer clamp.

Description of Related Art

Wafer-to-wafer bonding is used in a wide range of semiconductor fabrication applications for forming semiconductor devices. Wafer-to-wafer bonding involves the aligning of two wafer surfaces in contact with one another and then forming a bond interface between the two. The quality of the wafer-to-wafer bond largely depends upon the preservation of the alignment of the two wafers.

Prior to bonding, the opposing surfaces of two wafers are aligned, placed in contact with one another, and then held together by a wafer clamp. The purpose of the wafer clamp is to prevent relative motion between wafers during transport from an alignment tool to a permanent bonding tool. A typical wafer clamp includes first and second wafer holding elements and a clamping mechanism. The wafers are typically placed in contact with and held in contact with the respective wafer-clamping elements by electrostatic attraction. The clamp is then used to maintain the relative position between the two wafer holding elements. This is achieved typically by using the clamp to apply a clamping force to the two wafer holding elements or by stiffly connecting the wafer holding elements to one another.

The above-described wafer clamp is problematic. The clamping force applied to the first and second wafer holding elements tend to create lateral forces on the first and second wafers, which in turn, may cause the wafers to become misaligned. With misalignment, the bonding of the two wafers may be less than ideal.

SUMMARY OF THE INVENTION

The above-described problems are solved by a wafer-clamping system and method for clamping wafers together in alignment using pressure. The system and method involves holding a first wafer and a second wafer together in alignment using a wafer clamp within an ambient environment maintained at a first pressure and creating a second pressure at least partially around and between the first wafer and the second wafer held together by the wafer clamp, wherein the first pressure is greater than the second pressure. The first wafer and the second wafer are clamped together in alignment using a pneumatic force created by a pressure differential between the first pressure and the second pressure. The non-contact clamping force created by the pneumatic pressure significantly reduces misalignment of two wafers during both clamping and subsequent bonding operations.

BRIEF DESCRIPTION OF THE DRAWINGS

The invention may best be understood by reference to the following description taken in conjunction with the accompanying drawings, which illustrate specific embodiments of the invention.

FIGS. 2A-2E illustrates a series of cross-section diagrams showing the clamping of two wafers using the wafer clamp of FIG. 1.

FIGS. 4A-4D illustrates a series of cross-section diagrams showing the clamping of two wafers using the wafer clamp of FIG. 3.

FIGS. 5A-5E shows another non-exclusive series of cross-section diagrams illustrating the clamping of two wafers in accordance with another non-exclusive embodiment of the present invention.

FIGS. 6A and 6B illustrate two additional non-exclusive embodiments of a seal used in the wafer clamp in accordance with the principles of the present invention.

FIGS. 8A-8D show cross sections of the wafer clamp illustrated in FIGS. 7A and 7B.

FIGS. 10A-10D show cross sections of the wafer clamp illustrated in FIGS. 9A and 9B.

FIG. 11 illustrates another wafer clamp in accordance with the principles of the present invention.

FIG. 12 illustrates yet another wafer clamp in accordance with the principles of the present invention.

It should be noted that like reference numbers refer to like elements in the figures.

The above-listed figures are illustrative and are provided as merely examples of embodiments for implementing the various principles and features of the present invention. It should be understood that the features and principles of the present invention may be implemented in a variety of other embodiments and the specific embodiments as illustrated in the Figures should in no way be construed as limiting the scope of the invention.

DETAILED DESCRIPTION OF SPECIFIC EMBODIMENTS

The invention will now be described in detail with reference to various embodiments thereof as illustrated in the accompanying drawings. In the following description, specific details are set forth in order to provide a thorough understanding of the invention. It will be apparent, however, to one skilled in the art, that the invention may be practiced without using some of the implementation details set forth herein. It should also be understood that well known operations have not been described in detail in order to not unnecessarily obscure the invention.

Figure 1:
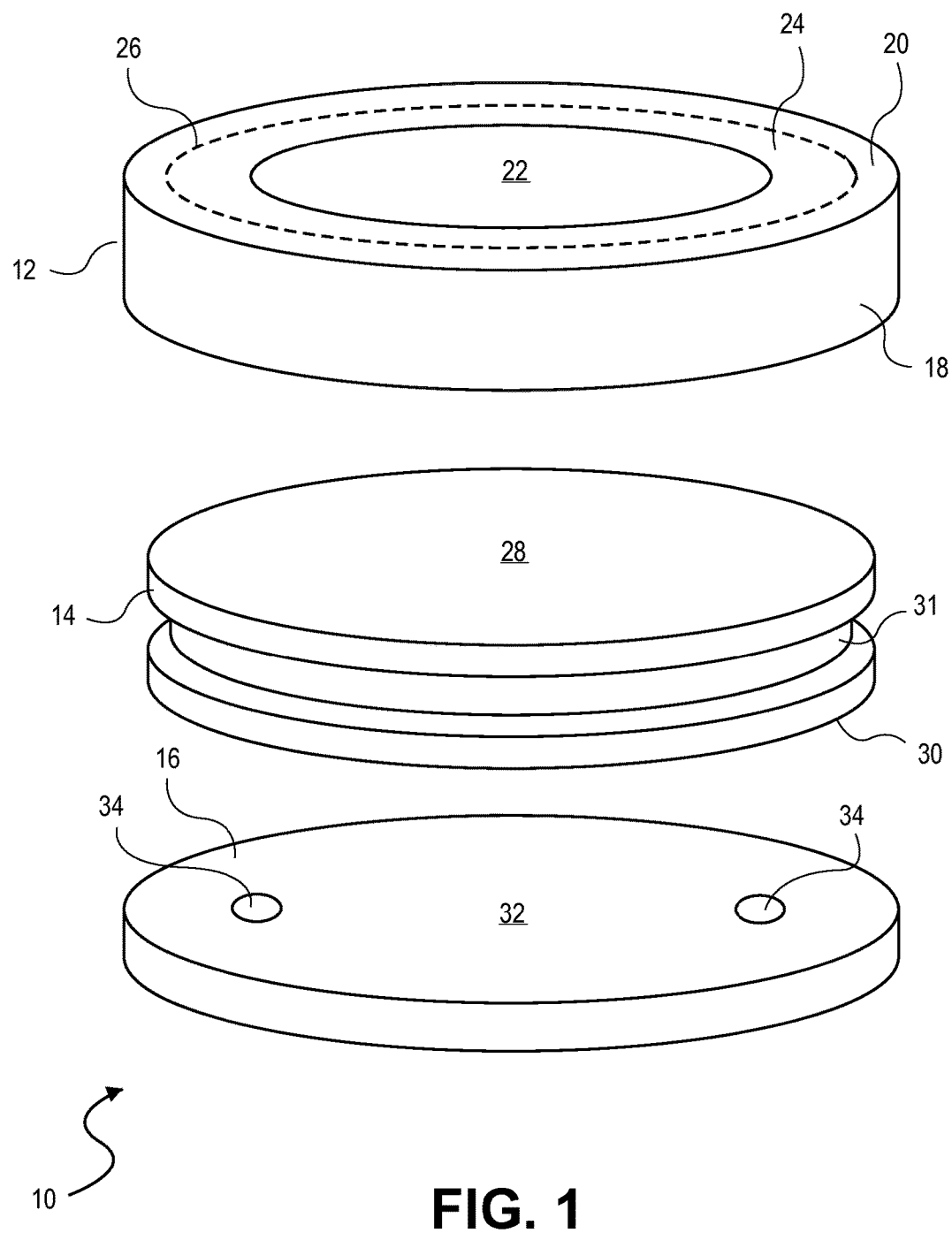
FIG. 1 is an exploded, perspective, view of a non-exclusive embodiment of a wafer clamp in accordance with the principles of the present invention.

Referring to FIG. 1, an exploded, perspective, view of a non-exclusive embodiment of a wafer clamp 10 in accordance with the principles of the present invention is shown. The wafer clamp 10 includes a seal ring 12, a first wafer-clamping element 14 and a second wafer-clamping element 16.

The seal ring 12 is annular in shape and includes a circular, sidewall, ring 18 around the perimeter of outer seal ring 12. The top surface 20 of the seal ring 12 includes a recess region 22 formed therein. The top surface 20 also defines an overhang region 24, which is defined by the dashed line 26 appearing in the figure. The overhang region is also circular in shape and extends inward from the sidewall ring 18 around the perimeter toward the recess region 22.

The first wafer-clamping element 14, which is also annular or circular in shape, includes a top surface 28, a first wafer-clamping surface 30 provided at the bottom of the element 14, and an optional channel 31 formed between the surfaces, 28 and 30. The second wafer-clamping element 16 includes a second wafer-clamping surface 32 provided at the top of element 16. A vacuum port 34 is also formed through the thickness of the second wafer-clamping element 16. The two wafer-clamping surfaces 30 and 32 are configured to oppose one another during wafer alignment and clamping.

Figure 2E:
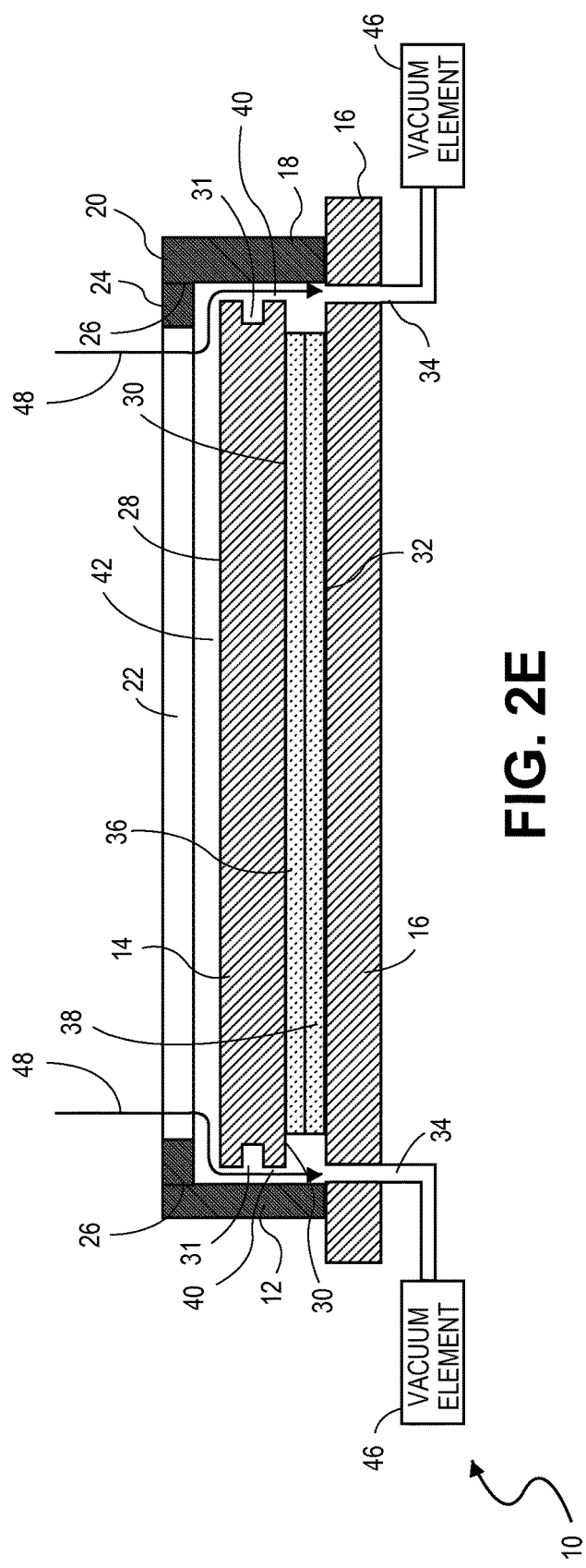

Referring to FIGS. 2A-2D, a non-exclusive series of cross-section diagrams illustrating the clamping of two wafers 36, 38 by the wafer clamp 10 in accordance with the principles of the present are shown. More specifically, FIGS. 2A-2E show the gradual movement of the wafer clamp 10, e.g., the first wafer-clamping element 14 and/or the second wafer-clamping element 16, from an unclamped position (as shown in FIG. 2A) to a clamped position (as shown in FIG. 2E).

In FIG. 2A, the back or non-active surfaces of the two wafers 36, 38 to be bonded are placed in contact with the first wafer-clamping surface 30 of first wafer-clamping element 14 and the second wafer-clamping surface 32 of the second wafer-clamping element 16 respectively. With this arrangement, the two active surfaces of the wafers 36, 38 are opposed, but not in contact or alignment, with one another. The seal ring 12 is then placed over the first wafer-clamping element 14. The seal ring 12 contacts and is supported by the top surface 28 of the first wafer-clamping element 14 at the overhang region 24. The pressure both internal and external to the clamp 10 is at atmospheric pressure.

In FIG. 2B, the optional channel 31 between the top surface 28 and the first wafer-clamping surface 30 is pressurized to a pressure $P_o$, which causes centering of the seal ring 12 around the first wafer-clamping element 14. The centering of the seal ring 12 is illustrated by comparing the position of the first wafer-clamping element 14 and wafer 36 relative to the circular, side-wall, ring 18 of the seal ring 12 in FIGS. 2B and 2A. As a result of the centering, an even seal ring gap 40 is formed between the circular, sidewall, ring 18 around the outer perimeter of the seal ring 12 and the side surfaces of the first wafer-clamping element 14. In an alternative embodiment (not illustrated), the channel 31 may be formed in the inner sidewall ring 18 around the inner perimeter of the seal ring 12, and not in first wafer-clamping element 14. In yet another embodiment, a channel 31 may be formed in both the first wafer-clamping element 14 and the side-wall 18 of the seal ring 12. Regardless of the embodiment, when the channel(s) 31 is/are pressurized to $P_o$, it causes a centering of the first wafer-clamping element 14 with respect to the seal ring 12. In various embodiments, $P_o$ ranges from 105 kPa to 125 kPa.

In FIG. 2C, the two wafers 36, 38 are coarsely aligned with respect to one another. In various embodiments, alignment may be achieved by moving the first wafer-clamping element 14 while the second wafer-clamping element 16 remains stationary, moving the second wafer-clamping element 16 while the first wafer-clamping element 14 remains stationary, or moving both the first and the second wafer-clamping elements 14, 16 with respect to one another. In addition, the two wafers 36, 38 are moved closer to one another so that the bottom of the circular, side-wall, ring 18 around the perimeter of the seal ring 12 is positioned in contact with, and supported by, the second wafer-clamping surface 32 of the second wafer-clamping element 16. As a result, the seal ring 12 is no longer in contact with the first wafer-clamping element 14, resulting in a gap 42 between the two.

In FIG. 2D, the two wafers 36, 38 are finely aligned with respect to one another. The fine alignment is performed by moving one or both of the first and second wafer-clamping surfaces 14, 16 as described above. Once the wafers 36, 38 are in final alignment, they are placed into contact with one another. In alternative embodiments, $P_o$ is or is not removed from the channel(s) 31 before fine alignment.

In FIG. 2E, a vacuum element 46, fluidly coupled to the vacuum port 34 of the second wafer-clamping element 16, is activated. As a result, a vacuum is created between the first and second wafer-clamping surfaces 30, 32. A differential pressure is thus created between the ambient environment or pressure surrounding the clamp 10 and the vacuum between clamping surfaces 30, 32 and the wafers 36, 38 via a "leaky" or partial seal. The partial seal is created by the flow of gas from the higher pressure ambient environment, through the recess region 22 formed in the seal ring 12, the gaps 40, 42 and finally to the vacuum between the first and the second wafer-clamping surfaces 30, 32 created by the vacuum element 46 through vacuum port 34, as represented in FIG. 2E by the arrows 48 showing the gas flow path.

Figure 3:
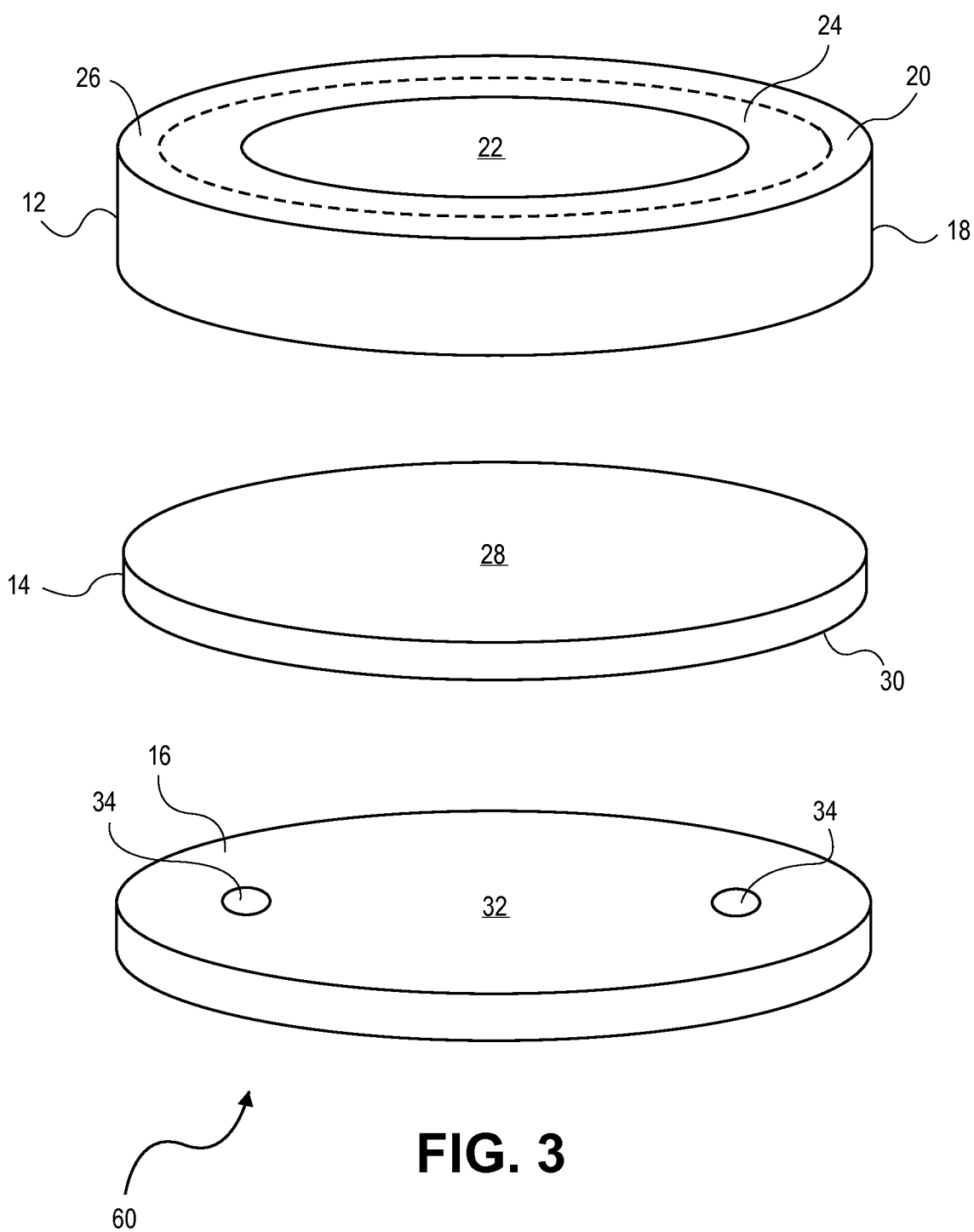
FIG. 3 is an exploded, perspective, view of another non-exclusive embodiment of a wafer clamp in accordance with the principles of the present invention.
Figure 5E:
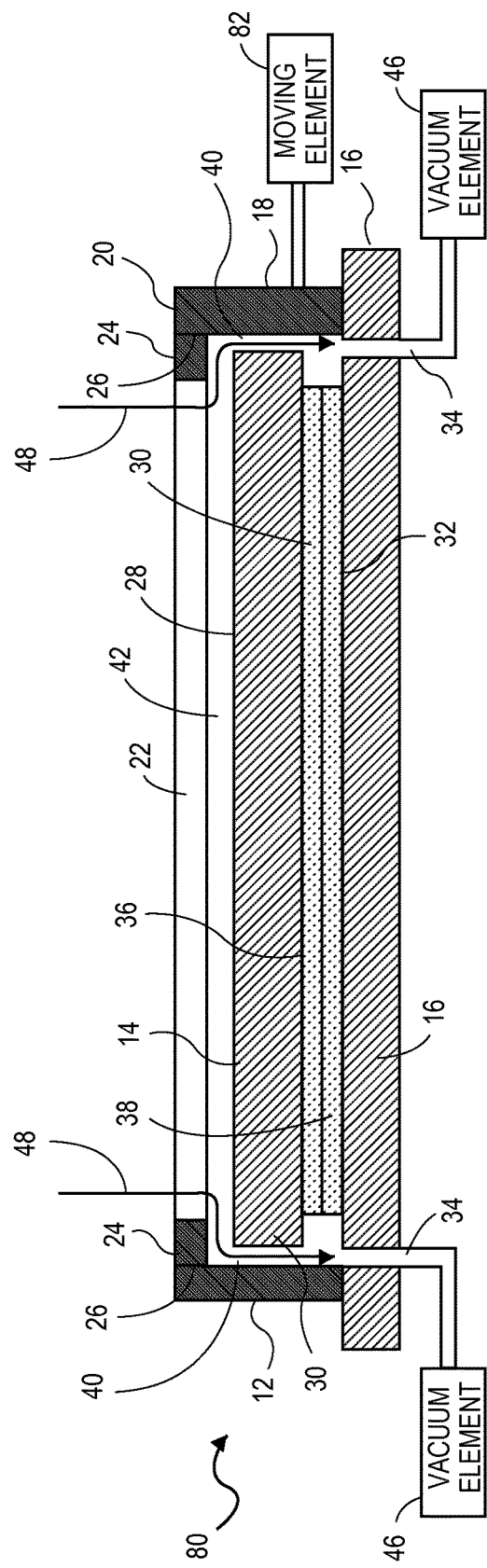

Referring to FIG. 3, an exploded, perspective, view of another non-exclusive embodiment of a wafer clamp 60 in accordance with the principles of the present invention is shown. The wafer clamp 60 includes seal ring 12, first wafer-clamping element 14 and second-wafer-clamping element 16. The components of the wafer clamp 60 are essentially the same as those as described above with regard to the wafer clamp 10 of FIG. 1, with the exception that the first wafer-clamping element 14 and/or the side-wall ring 12 of the seal ring 12 do not include the channel 31.

Referring to FIGS. 4A-4D, a non-exclusive series of cross-section diagrams illustrating the clamping of two wafers 36, 38 by wafer clamp 60 in accordance with the principles of the present invention are shown. In this embodiment, the step of FIG. 4A is identical to FIG. 2A. The step of FIG. 2B, however, is eliminated because there is no channel(s) 31 to pressurize to $P_o$. The subsequent steps 4B-4D are similar to 2C-2E as described above, except the seal ring 12 is not necessarily centered relative to the first wafer-clamping element 14. As a result, the gap 40 may not be substantially even between the first wafer-clamping element 14 and the side-wall 18 of the seal ring 12. This arrangement offers a simpler design, as the pressure element (not illustrated) required to create the pressure $P_o$ can be eliminated, advantageously resulting in a simpler holder design and simpler clamping process. A potential disadvantage of not centering is the possibility of not uniformly heating the wafers and the wafer-clamping elements 14, 16 in a substantially deterministic manner during later bonding operations.

FIGS. 5A-5E show another non-exclusive series of cross-section diagrams illustrating a wafer clamp 80 for clamping two wafers 36, 38 in accordance with the principles of the present invention. The embodiment of FIGS. 5A-5E are essentially the same as FIGS. 4A-4D, except a moving element 82 is provided to move the seal ring 12 so that the gap 40 between the between the first wafer-clamping element 14 and the side-wall 18 of the seal ring 12 is substantially even. For example, the moving element 82 may coarsely position the seal ring 12 following the coarse alignment step of FIG. 5C, and then, more precisely following the fine alignment step in FIG. 5D.

FIG. 6A illustrates a cross section diagram of another clamp 90 including a rigid seal ring 92 provided between the first wafer-clamping surface 30 and the second wafer-clamping surface 32 and surrounding the two wafers 36, 38. The rigid seal 92 includes a gap 93 that provides a partial or leaky seal between the vacuum ($P_{vac}$) created in region between the two wafer-clamping surfaces 30, 32 and the ambient pressure ($P_{atm}$). As a result, a differential pressure is created by gas flow from the ambient pressure ($P_{atm}$), through the gap 93 of the rigid seal 92, to the vacuum ($P_{vac}$), resulting in the clamping of the two wafers 36, 38 between the first and the second wafer clamping elements 14 and 16. The advantage of using the rigid seal 92 is that it eliminates the need of using the seal ring 12. The height of the rigid seal ring 92, however, ideally should be substantially the same as the height of the two wafers 36, 38. A gap equal to or less than 5 um is more practical because of surface flatness. Alternatively there can be one rigid seal that ideally having the same height as the sum of the two wafer heights. Alternatively, similar to embodiment associated with FIG. 12, rigid seals can be exchangeable. Therefore, a rigid seal of appropriate height can be selected from a library of rigid seals stored on the wafer stacking system. The upper or lower wafer holder can have a dedicated vacuum chuck for holding the rigid seal relative to the holder. Also, ideally the rigid seal material has same thermal expansion coefficient as the wafers, so the gap will be maintained during heating in a permanent bonding process.

Referring to FIG. 6B, an alternative embodiment of the clamp 90 is illustrated. In this embodiment, the gap 93 of the rigid seal 92 is eliminated. Instead, a conduit 96 is provided between the bottom of the rigid seal 92 and the wafer-clamping surface 32 of the wafer-clamping element 16, creating a leaky seal between the vacuum ($P_{vac}$) and the ambient pressure ($P_{atm}$). As a result, a differential pressure is created by gas flow from the ambient pressure ($P_{atm}$), through the conduit 96, to the vacuum ($P_{vac}$), resulting in the clamping of the two wafers 36, 38 between the first and the second wafer-clamping elements 14 and 16. In addition, a resilient element 100 is provided within a recess 102 formed in the first wafer-clamping element 14. During wafer clamping, the resilient element 100 urges the rigid seal 92 either up or down within the recess 102, depending on the thickness of the two wafers 36, 38. In various embodiments, the rigid seal 92 is positioned so that the height of the conduit 96 becomes nominally zero microns. With the ability to vertically position the rigid seal 92, the embodiment of FIG. 6B can be used with wafer pairs 36, 38 with different stacked heights.

Figure 7A:
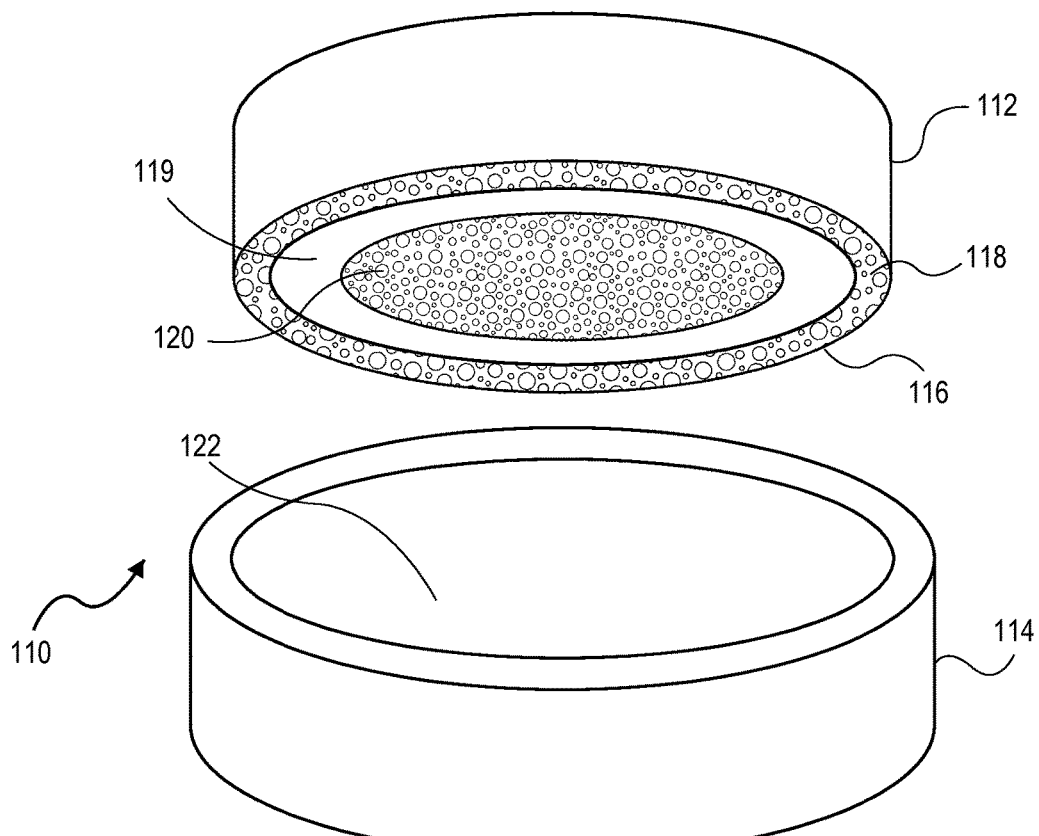
FIGS. 7A and 7B illustrate several views of another wafer clamp embodiment in accordance with the principles of the present invention.
Figure 7B:
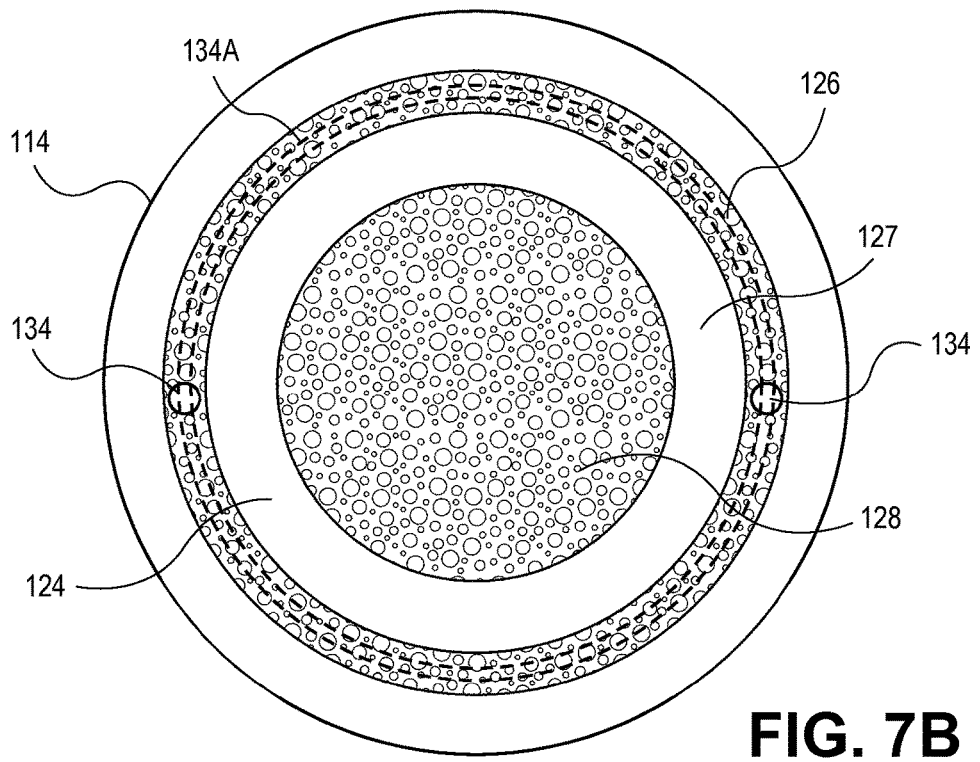

FIGS. 7A and 7B illustrate different views of another wafer clamp 110 of the present invention. In FIG. 7A, perspective views of a first wafer-clamping element 112 and a second wafer-clamping element 114 are shown. The first wafer-clamping element 112 is round in shape and has a circumference approximately the same size of the wafers to be clamped. The first wafer-clamping element 112 further defines a first wafer-clamping surface 116, which includes an outer porous region 118, a non-porous region 119, and an inner porous region 120. The second wafer-clamping element 114 is "cup-shaped" and includes a recess 122 that is configured to receive the first wafer-clamping element 112 during wafer clamping. In FIG. 7B, a top-down view of the second wafer-clamping element 114 is shown. The bottom of the recess 122 of the second clamping element 114 defines a second wafer-clamping surface 124, which includes an outer porous region 126, a non-porous region 127, and an inner porous region 128. In addition, vacuum ports 134 are fluidly coupled to the outer porous region 128, as illustrated by the dashed circle 134A in region 128.

The three regions 118, 119, and 120 of the first wafer-clamping surface 116 and the three regions 126, 127 and 128 of the second wafer-clamping surface 124 are both configured in complementary concentric circle arrangements. When the first wafer-clamping element 114 is placed within the recess 122 of the second wafer-clamping element 114, the regions 118, 119 and 120 of the first wafer-clamping surface 116 and the three regions 126, 127 and 128 of the second wafer-clamping surface 124 are vertically aligned respectively.

Referring to FIGS. 8A-8D, a series of cross section diagrams illustrating the clamping operation of the clamp 110 of FIGS. 7A and 7B are shown. The porous regions 118, 120, 126 and 128 are each selectively fluidly coupled to either $P_{2vac}$ or $P_{atm}$. The vacuum port 134 is selectively coupled to $P_{1vac}$. A series of valves 129 are used to selectively and fluidly couple the regions 118, 120, 126 and 128 to either $P_{2vac}$ or $P_{atm}$ and the vacuum port 134 to $P_{1vac}$ respectively.

In FIG. 8A, a first wafer 36 is loaded onto the first wafer-clamping surface 116 of the first wafer-clamping element 112 and a second wafer 38 is loaded onto the second wafer-clamping surface 124 of the second-wafer-clamping element 114. Porous regions 118, 120 of the first wafer-clamping element 112 are in fluid communication with $P2_{vac}$, which holds the wafer 36 in place adjacent the first wafer-clamping surface 116. Similarly, porous regions 126 and 128 of the second wafer-clamping element 114 are fluidly coupled to $P2_{vac}$, which holds the wafer 38 in place adjacent the second wafer-clamping surface 124. The vacuum port 134 is disconnected from vacuum $P_{1vac}$.

In FIG. 8B, the two wafers 36, 38 are positioned approximately close to one another and coarsely aligned. In various embodiments, the wafers 36, 38 may be positioned 50 to 150 microns apart. Then, vacuum $P_{1vac}$ is applied through the vacuum ports 134, creating the vacuum between the first and second wafer-clamping surfaces 116, 124 and wafers 36, 38. Porous regions 126, 128 of the second wafer-clamping element 114 are both maintained at $P_{2vac}$, holding the second wafer 38 in position on the second wafer-clamping surface 124. With the first wafer-clamping element 112, $P_{atm}$ is applied to the porous region 120 at the center of the wafer 36, while vacuum $P_{2vac}$ is applied to the porous region 118 around the outer periphery of the wafer 36. The combination of $P_{2vac}$ being larger than $P_{1vac}$, the center of wafer 36 exposed to $P_{atm}$, and the vacuum between the first and second wafer-clamping surfaces 116, 124, causes the periphery of the wafer 36 to maintain contact with the first wafer-clamping surface 114, while the center of the wafer 36 bows downward toward wafer 38.

In FIG. 8C, the wafers 36, 38 are finely aligned, while maintaining porous regions 118, 120, 126 and 128 and vacuum port 134 the same as provided with respect to FIG. 8B. Since the first wafer 36 is supported around its periphery via the $P_{2vac}$ applied to the outer porous region 118 of the first wafer-clamping element 112, the nearest distance between the two wafers 36, 38 will be near the center, where wafer 36 is bowed. Next, the bowed center region of wafer 36 is placed in contact with the wafer 38. Then, the wafer 36 is gradually moved downward with respect to wafer 38 by moving one or both wafer-clamping elements 112, 114 toward one another, causing the contact interface between the two wafers 36, 38 to radially propagate outward from the center to the periphery of two wafers 36, 38. By maintaining the porous region 118 coupled fluidly with $P_{2vac}$ during the wafer clamping operation described above, wafer 36 is held in place, reducing alignment errors.

In FIG. 8D, The pressure applied to porous regions 118, 120,126 and 128 are transitioned from $P_{2vac}$ to $P_{atm}$, $P_{1vac}$ is continually applied via the ports 134, maintaining the vacuum between the first and second wafer-clamping surfaces 116, 124. As a result, the two wafers 36, 38 are clamped together. A differential pressure is thus created via a "leaky" or partial seal by the flow of gas from regions of high pressure $P_{atm}$ to low pressure between the first and second wafer-clamping surfaces 116, 124 created by the vacuum $P_{1vac}$. The partial seal results from the flow of gas from the ambient environment $P_{atm}$, through a gap 130 between the first and second wafer-clamping elements 112, 114, as represented in FIG. 8D by the arrows 132 showing the gas flow path. In an alternative embodiment, $P_{2vac}$ may be applied to porous regions 118, 126 of the first and second wafer-clamping elements 112, 114 to maintain the wafers 36, 38 in alignment during transport to a wafer bonding apparatus for example.

Figure 9:
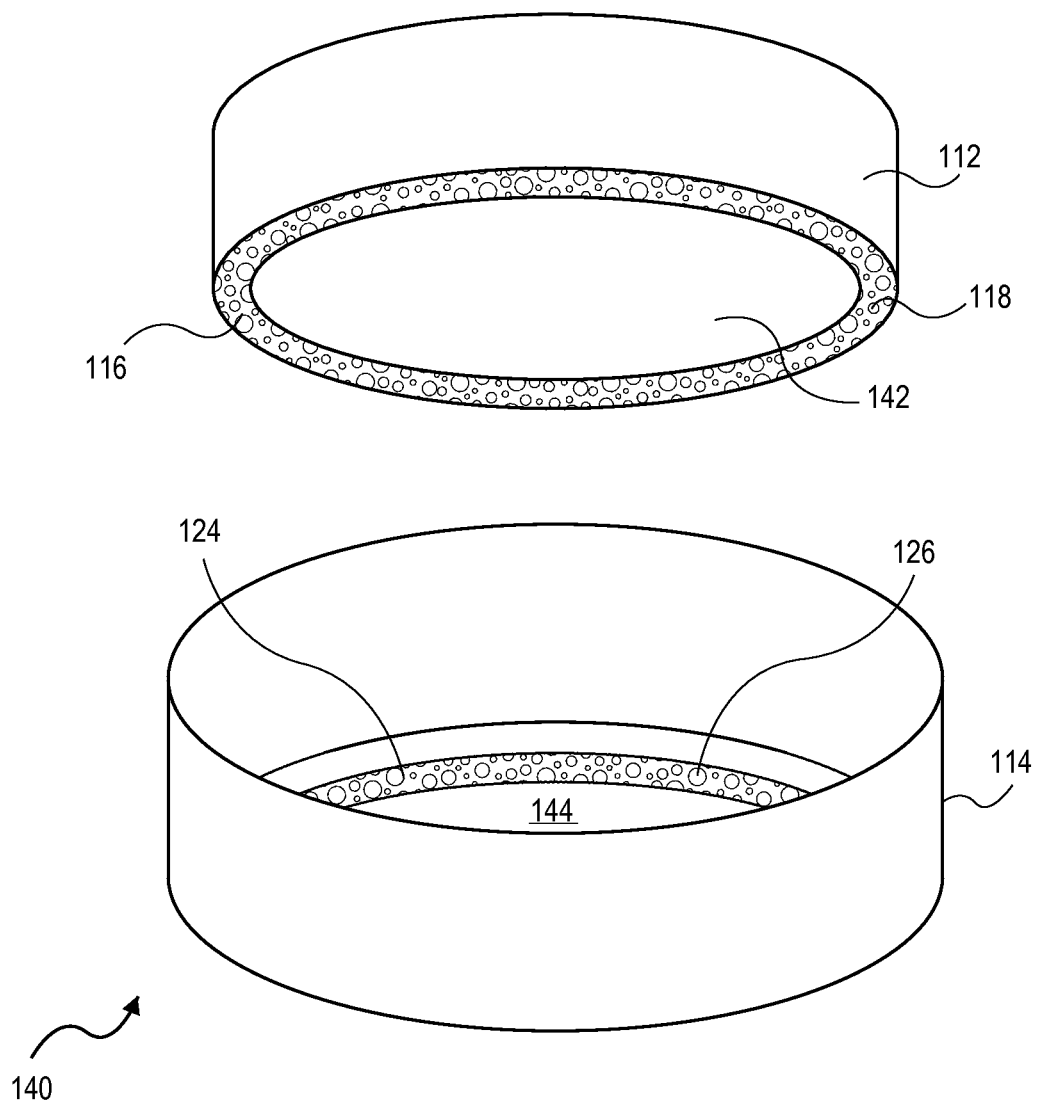
FIG. 9 illustrates another wafer clamp embodiment in accordance with the principles of the present invention.

Referring to FIG. 9, another wafer clamp 140 of the present invention is shown. The clamp 140 is essentially the same as the clamp 110 of FIGS. 7A and 7B, except the inner porous region 120 of the first wafer-clamping element 112 and the inner porous region 128 of the second wafer-clamping element 114 are replaced with recesses 142, 144 respectively. Otherwise, the first and second wafer-clamping elements 112, 114 are the same as describe above. In variations of this embodiment, the recesses 142, 144 do not have to each be a single recess, but rather, may be partitioned into a number of smaller recess regions (not illustrated).

The operation of the clamp 140, as depicted in FIGS. 10A-10D, is essentially the same as described above with regard to clamp 110 in FIGS. 8A-8D. One difference between the operation of the clamp 110 and the clamp 140, however, is the recess regions 142, 144 are continually exposed to pressure $P_{atm}$, as opposed to selectively fluidity coupling the porous regions 120, 128 to $P_{2vac}$ as described above with regard to the FIGS. 7 and 8A-8D embodiment. The main advantage of this arrangement is that it enables direct non-contact heating of the wafer during bonding operations. Direct wafer heating may enable faster heating rates, which will result in shorter process times and improved throughput. A possible shortcoming is that gravity may bow the wafers 36, 38 causing misalignment at the bond interface. This can be overcome by aligning wafers 36, 38 so the contacting faces substantially are parallel to the gravity vector. Any deformation to the wafers 36, 38 due to gravity would substantially equivalent and therefore misalignment will be negligibly small (<10 nm).

In various alternative embodiments of the clamps 110 and 140, bowing can also be induced in the second wafer 38 during steps 8B/10B and 8C/10C. With both wafers 36, 38 bowing as they make contact in the step illustrated in 8C/10C, better alignment will typically be achieved as the contact interface between the two wafers 36, 38 radiates outward.

In yet further embodiments, the porous regions 118, 120, 126, and 128 of the clamps 110 and 140 can be replaced with an electrostatic wafer chuck elements or pin chuck elements. In the latter example, the porous structures are replaced with an array of pins and the spaces between the pins are in fluid communication with the vacuum sources $P_{2vac}$ or $P_{atm}$ as described above.

Referring to FIG. 11, a clamp 160 in accordance with another embodiment of the present invention is shown. The clamp 160 includes the first and the second wafer-clamping elements 112, 114 and a seal ring 162 provided between the two. As a detailed explanation of the first and second clamping elements 112, 114 were previously provided, a detailed discussion is not provided herein. In various embodiments, the seal ring 162 may be an O-ring, an elastomer gasket, vacuum grease, or a liquid metal, such as a eutectic gallium alloy. The advantage of using liquid metal seal is that it can withstand the high temperatures applied to the wafers 36, 38 during bonding, as opposed to for example, an elastomer or O-ring seal that would degrade over time because of exposure to the relatively high process temperatures. The advantage of using an elastomer seal, however, is that there will be substantially no leakage because the compliant seal will conform to the asperities of the surface of the more rigid wafer holder.

Referring to FIG. 12, a clamp 170 in accordance with yet another embodiment of the present invention is shown. The clamp 170 includes the first and the second wafer-clamping elements 112, 114. As a detailed explanation of the first and second clamping elements 112, 114 were previously provided, a detailed discussion is not provided herein. In this embodiment, however, a number of different sized first wafer-clamping elements 112, each having a different dimension "D" (in increments of 5 um, for example) is provided. Thus for a given combined thickness of two stacked wafers 36, 38, a particular size first wafer-clamping elements 112 is selected in order to achieve a desired gap seal "d", thereby creating a very low-leak seal without a contact point between the two elements 112, 114. This embodiment requires a library of upper clamping elements 112, each with a different dimension D, so that the desired gap seal dimension d is achieved for the stacked height of a particular pair of wafers 36, 38. In various embodiments, the dimension of "d" ranges from 0 to 10 microns.

Figure 13:
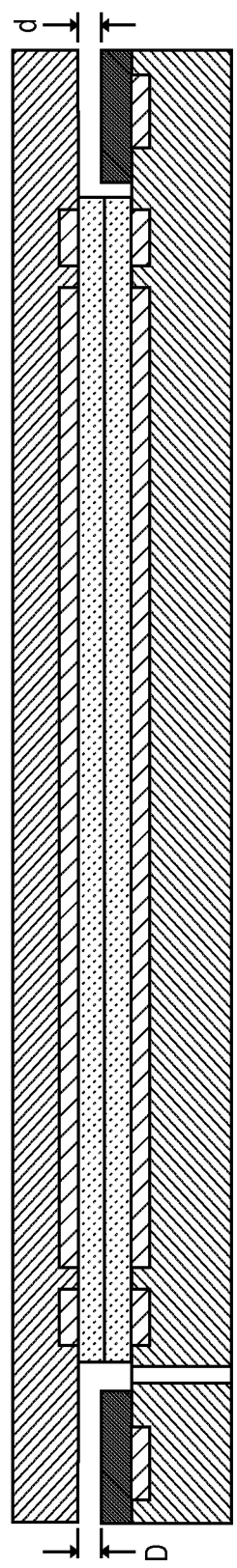
FIG. 13 illustrates yet another wafer clamp in accordance with the principles of the present invention.

Referring to FIG. 13, a clamp 190 in accordance with yet another embodiment of the present invention is shown. The clamp 190 includes the first and the second wafer-clamping elements 112, 114. As a detailed explanation of the first and second clamping elements 112, 114 were previously provided, a detailed discussion is not provided herein. The FIG. 13 embodiment differs from the FIG. 12 embodiment in that a library of rigid seals 192, each of a different height, are used as opposed to a library of upper wafer-clamping elements 112. As a result, a gap "d" of a desired height can be achieved by selecting the appropriate rigid seal 192, depending on the height of the wafers 36, 38. In addition, the lower wafer-clamping 114 may optionally include a vacuum chuck 194 for holding the rigid seal 192 in place. Also, the rigid seal 192 is made of a material that has same thermal expansion coefficient as the wafers 36, 38, so that uniformity of the gap d will be maintained during heating when the wafers are permanently bonded.

The various embodiments described herein may be used with wafers 36, 38 of various sizes, for example 300 mm wafers, 450 mm wafers, or wafers that are larger or smaller. Furthermore, in the various embodiments described herein, it should be understood that the wafers are positioned and aligned with respect to one another using one or more stages, as is well known in the art. Since these wafer-moving stages are well known, a detailed explanation is not described herein.

Finally, it should be understood that the various wafer clamps described herein are typically, although not necessarily, used for the prior to the bonding of the two wafers together in a wafer bonding apparatus. Typically, two (or more) wafers are aligned and clamped together using one of the embodiments described herein. Once the wafers are aligned and clamped, the clamp is inserted into or otherwise used to transport the wafers to a wafer bonding apparatus.

The present application also incorporates commonly assigned, co-pending provisional patent application entitled Wafer Bonding System and Method, filed on the same day as the present application, by Alton Phillips.

Although many of the components and processes are described above in the singular for convenience, it will be appreciated by one of skill in the art that multiple components and repeated processes can also be used to practice the techniques of the system and method described herein. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the invention may be employed with a variety of components and should not be restricted to the ones mentioned above. It is therefore intended that the invention be interpreted to include all variations and equivalents that fall within the true spirit and scope of the invention.

What is claimed is:

1. A wafer clamp assembly for holding and clamping a first wafer to a second wafer in alignment, the wafer clamp assembly being positioned within an ambient environment contained within a chamber that is at a first pressure, the wafer clamp assembly comprising:
    a first wafer-clamping element that is configured to selectively retain the first wafer;
    a second wafer-clamping element that is configured to selectively retain the second wafer; and
    a pressure element for creating a second pressure in a region between the first wafer-clamping element and the second wafer-clamping element to move the first wafer-clamping element from an unclamped position to a clamped position, wherein the first pressure is greater than the second pressure;
    wherein the first wafer and the second wafer are held and clamped together in alignment between the first wafer-clamping element and the second wafer-clamping element using a pneumatic force created by a pressure differential between the first pressure and the second pressure; and
    wherein a gas flow path exists between the ambient environment within the chamber and the region between the first wafer-clamping element and the second wafer-clamping element to allow at least some flow of gas from the ambient environment within the chamber to the region between the first wafer-clamping element and the second wafer-clamping element.

2. The wafer clamp assembly of claim 1, further comprising an alignment element configured to align the first wafer and the second wafer prior to clamping.

3. The wafer clamp assembly of claim 2, wherein the alignment element is configured to perform a coarse alignment followed by a fine alignment.

4. The wafer clamp assembly of claim 3, wherein the alignment element is configured to perform the coarse alignment and the fine alignment by one of the following:
    (i) moving the first wafer while holding the second wafer stationary;
    (ii) moving the second wafer while holding the first wafer stationary; or
    (iii) moving both the first wafer and the second wafer.

5. The wafer clamp assembly of claim 1, wherein each of the wafer-clamping elements includes one of the following:
    (i) one or more porous regions;
    (ii) a plurality of pins; or
    (iii) an electrostatic surface.

6. The wafer clamp assembly of claim 1, further comprising a rigid seal provided between a first wafer-clamping surface of the first wafer-clamping element and a second wafer-clamping surface of the second wafer-clamping element, the rigid seal defining a gap between the first wafer-clamping surface and the second wafer-clamping surface for providing fluid communication between the ambient environment maintained at the first pressure and the second pressure created in the region between the first wafer-clamping element and the second wafer-clamping element.

7. The wafer clamp assembly of claim 6, further comprising a height-adjustable seal provided between the first wafer-clamping surface and the second wafer-clamping surface for accommodating the height of the two wafers.

8. The wafer clamp assembly of claim 6, further comprising a plurality of rigid seals, each of the plurality of rigid seals having a different height, wherein one of the plurality of rigid seals is selected to define a desired gap dimension between the first wafer-clamping element and the second wafer-clamping element, depending on the height of the first wafer and the second wafer.

9. The wafer clamp assembly of claim 1, further comprising a seal ring provided between the first wafer-clamping element and the second wafer-clamping element.

10. The wafer clamp assembly of claim 9, wherein the seal ring comprises one of the following:
    O-ring;
    an elastomer gasket;
    vacuum grease; or
    a liquid metal.

11. The wafer clamp assembly of claim 9 wherein the seal ring is annular-shaped.

12. The wafer clamp assembly of claim 1, wherein the pressure element includes a vacuum element fluidly coupled between the first wafer-clamping element and the second wafer-clamping element.

13. The wafer clamp assembly of claim 12, further comprising a vacuum port formed in the first wafer-clamping element for fluidly coupling the vacuum element to space between the first wafer-clamping element and the second wafer-clamping element.

14. The wafer clamp assembly of claim 1, further comprising a wafer-bowing element configured to bow the first wafer so that a contact interface region between the two wafers is defined and a moving element configured to move the two wafers closer together so that the contact interface region between the two wafers radially propagates outward from the center of the two wafers to the periphery of the two wafers as the two wafers are moved closer together.

15. The wafer clamp assembly of claim 14, wherein the wafer-bowing element is further configured to bow the second of the two wafers while the moving element moves the two wafers closer together.

16. The wafer clamp assembly of claim 1, wherein the pneumatic force holding and clamping the two wafers together in alignment is applied directly onto the first wafer and the second wafer by exposing at least portions of the first wafer and the second wafer to the ambient environment at the first pressure while the second pressure is created in the region between the first wafer-clamping element and the second wafer-clamping element.

17. The wafer clamp assembly of claim 1, wherein the pressure differential between the first pressure and the second pressure creating the pneumatic force acts on the first-wafer-clamping element and the second-wafer-clamping element, which in turn, clamp the first wafer and the second wafer together.

18. The wafer clamp assembly of claim 1, wherein the first wafer-clamping element contacts substantially all of a first surface of the first wafer and the second wafer-clamping element contacts substantially all of a second surface of the second wafer respectively.

19. The wafer clamp assembly of claim 1, wherein the first wafer-clamping element contacts the first wafer at a first periphery of the first wafer and the second wafer-clamping element contacts the second wafer at a second periphery of the second wafer, while center regions of the first wafer and the second wafer are exposed to the ambient environment.

20. The wafer clamp assembly of claim 1, wherein the gas flow path includes a partial seal provided between the second pressure created in the region between the first wafer-clamping element and the second wafer-clamping element and the ambient environment maintained at the first pressure in the chamber.

21. The wafer clamp assembly of claim 1, further comprising:
    a plurality of first wafer-clamping elements, each of the plurality of first wafer-clamping elements having a different height;
    wherein a selected one of the plurality of first wafer-clamping elements is used to define a desired gap dimension between the selected first wafer-clamping element and the second wafer-clamping element, depending on the height of the first wafer and the second wafer held together and clamped in alignment.

22. The wafer clamp assembly of claim 1, wherein the chamber is a hyperbaric chamber.

23. The wafer clamp assembly of claim 1 wherein at least one of the first wafer-clamping element and the second wafer-clamping element is annular-shaped.

24. The wafer clamp assembly of claim 1 wherein the first wafer and the second wafer are approximately the same size and shape.

25. A wafer clamp assembly for holding and clamping a first wafer to a second wafer in alignment, the wafer clamp assembly being positioned within an ambient environment contained within a chamber that is at a first pressure, the wafer clamp assembly comprising:
    a first wafer-clamping element that is configured to selectively retain the first wafer, the first wafer-clamping element being annular-shaped and including a first wafer-clamping surface having a first outer porous region;
    a second wafer-clamping element that is configured to selectively retain the second wafer, the second wafer-clamping element being cup-shaped and including a second wafer-clamping surface having a second outer porous region and a recess that is configured to receive the first wafer-clamping element; and
    a pressure element for creating a second pressure in a region between the first wafer-clamping element and the second wafer-clamping element to move the first wafer-clamping element from an unclamped position to a clamped position, wherein the first pressure is greater than the second pressure;
    wherein the first wafer and the second wafer are held and clamped together in alignment between the first wafer-clamping element and the second wafer-clamping element using a pneumatic force created by a pressure differential between the first pressure and the second pressure.

26. The wafer clamp assembly of claim 25 further comprising an alignment element configured to align the first wafer and the second wafer prior to clamping.

27. The wafer clamp assembly of claim 26 wherein the alignment element is configured to perform a coarse alignment followed by a fine alignment.

28. The wafer clamp assembly of claim 27 wherein the alignment element is configured to perform the coarse alignment and the fine alignment by one of the following:
    (i) moving the first wafer while holding the second wafer stationary;
    (ii) moving the second wafer while holding the first wafer stationary; or
    (iii) moving both the first wafer and the second wafer.

29. The wafer clamp assembly of claim 25 wherein the pressure element includes a vacuum element fluidly coupled between the first wafer-clamping element and the second wafer-clamping element.

30. The wafer clamp assembly of claim 29 further comprising a vacuum port formed in the first wafer-clamping element for fluidly coupling the vacuum element to space between the first wafer-clamping element and the second wafer-clamping element.

31. The wafer clamp assembly of claim 25 further comprising a wafer-bowing element configured to bow the first wafer so that a contact interface region between the two wafers is defined and a moving element configured to move the two wafers closer together so that the contact interface region between the two wafers radially propagates outward from the center of the two wafers to the periphery of the two wafers as the two wafers are moved closer together.

32. The wafer clamp assembly of claim 31 wherein the wafer-bowing element is further configured to bow the second of the two wafers while the moving element moves the two wafers closer together.

33. The wafer clamp assembly of claim 25 wherein the first outer porous region of the first wafer-clamping element and the second outer porous region of the second wafer-clamping element are fluidly coupled to an ambient pressure control element.

34. The wafer clamp assembly of claim 25 wherein the pneumatic force holding and clamping the two wafers together in alignment is applied directly onto the first wafer and the second wafer by exposing at least portions of the first wafer and the second wafer to the ambient environment at the first pressure while the second pressure is created in the region between the first wafer-clamping element and the second wafer-clamping element.

35. The wafer clamp assembly of claim 25 wherein the pressure differential between the first pressure and the second pressure creating the pneumatic force acts on the first-wafer-clamping element and the second-wafer-clamping element, which in turn, clamp the first wafer and the second wafer together.

36. The wafer clamp assembly of claim 25 wherein the first wafer-clamping element contacts substantially all of a first surface of the first wafer and the second wafer-clamping element contacts substantially all of a second surface of the second wafer respectively.

37. The wafer clamp assembly of claim 25 wherein the first wafer-clamping element contacts the first wafer at a first periphery of the first wafer and the second wafer-clamping element contacts the second wafer at a second periphery of the second wafer, while center regions of the first wafer and the second wafer are exposed to the ambient environment.

38. The wafer clamp assembly of claim 25 wherein the first wafer and the second wafer are approximately the same size and shape.

* * * * *